US008908875B2

(12) United States Patent
De Sena et al.

(10) Patent No.: US 8,908,875 B2
(45) Date of Patent: Dec. 9, 2014

(54) ELECTRONIC DEVICE WITH DIGITAL REVERBERATOR AND METHOD

(75) Inventors: Enzo De Sena, London (GB); Zoran Cvetkovic, London (GB); Huseyin Hacihabiboglu, Ankara (TR)

(73) Assignee: King's College London, London (GB)

( * ) Notice: Subject to any disclaimer, the term of this patent is extended or adjusted under 35 U.S.C. 154(b) by 300 days.

(21) Appl. No.: 13/364,998

(22) Filed: Feb. 2, 2012

(65) Prior Publication Data

US 2013/0202125 A1 Aug. 8, 2013

(51) Int. Cl.
*H03G 3/00* (2006.01)

(52) U.S. Cl.
USPC .......................................................... 381/63

(58) Field of Classification Search
USPC .............................. 381/63, 66; 370/286, 289; 379/406.01–406.16; 700/94
See application file for complete search history.

(56) References Cited

U.S. PATENT DOCUMENTS

| | | | | |
|---|---|---|---|---|
| 5,471,007 | A * | 11/1995 | Van Duyne et al. | 84/622 |
| 6,091,824 | A * | 7/2000 | Lin et al. | 381/63 |
| 2003/0007648 | A1 * | 1/2003 | Currell | 381/61 |
| 2012/0016640 | A1 * | 1/2012 | Murphy | 703/2 |

OTHER PUBLICATIONS

L. Savioja and V. Valimaki, "Interpolated Rectangular 3-D Digital Waveguide Mesh Algorithms with Frequency Warping," IEEE Trans. on Speech and Audio Process., vol. 11, No. 6, 2004, pp. 783-790, 8 pages.

S. D. Bilbao, Wave and scattering methods for numerical simulation, "1.1.3 Digital Waveguide Networks," Wiley, 2004, pp. 12-18, 7 pages.

M. Vorlander, Auralization: Fundamentals of acoustics, modeling, simulation, algorithms and acoustic virtual reality, Springer Verlag, 2008, pp. 576-588, 13 pages.

W. K. Kuhl, "The Acoustics and Technical Properties of the Reverberation Plate," EBU Rev., vol. 49A, 1958, pp. 8-14, 7 pages.

A. Watt and F. Policarpo, 3D Games: Real-Time Rendering and Software Technology, ser. Siggraph Series, Addison Wesley, 2000, vol. 1, pp. 170-171, 2 pages.

A. V. Oppenheim, R. W. Schafer, and J. R. Buck, Discretetime signal processing, 2nd ed. Prentice-Hall, 1999, pp. 147-150, 4 pages.

E. De Sena, H. Hac1habiboglu, and Z. Cvetkovic, "Scattering Delay Network: an Interactive Reverberator for Computer Games," AES 41st International Conference, London, UK, Feb. 2-4, 2011, 11 pages.

(Continued)

*Primary Examiner* — Vivian Chin
*Assistant Examiner* — Karl Mihm
(74) *Attorney, Agent, or Firm* — Lewis, Rice & Fingersh, L.C.

(57) ABSTRACT

Electronic devices having digital reverberators are disclosed, together with a method of reproducing sound for a user with the digital reverberator. The digital reverberator uses digital surface absorption filters positioned in the reverberator to simulate absorption of energy as digital audio data samples are reflected from virtual surfaces. The position of the digital surface absorption filters enables known frequency-dependent surface absorption characteristics of real materials to be directly implemented using the filter coefficients of each digital surface absorption filter. This enables virtual acoustic spaces to be designed quickly without the need for the digital reverberator to be manually tuned for each space.

17 Claims, 14 Drawing Sheets

(56) References Cited

OTHER PUBLICATIONS

E. De Sena, H. Hac1habiboglu, and Z. Cvetkovic, "Frequency-Domain Scattering Delay Networks for Simulating Room Acoustics in Virtual Environments," 2011 Seventh International Conference on Signal Image Technology & Internet-Based Systems, pp. 180-187, 8 pages.
L. Savioja, J. Huopaniemi, T. Lokki and R. Vaananen, "Creating Interactive Virtual Acoustic Environments," J. Audio Eng. Soc., vol. 47, No. 9, pp. 675-705, 1999, 31 pages.
J. Huopaniemi, "Virtual Acoustics and 3-D Sound in Multimedia Signal Processing," Ph.D. Thesis, Helsinki University of Technology, Espoo, Finland, 1999.
T. Funkhouser, N. Tsingos, I. Calborn, G. Elko, M. Sondhi, J.E. West, G. Pingali, P. Min and A. Ngan, "A Beam Tracing Method for Interactive Architectural Acoustics," J. Acoust. Soc. Am., vol. 115, No. 2, pp. 739-756, 2004, 18 pages.
M. Taylor, A. Chandak, L. Antani, and D. Manocha, "Resound: Interactive Sound Rendering for Dynamic Virtual Environments," in Proc. 17th Int. ACM Conf. on Multimedia, 271-280, Ed., Beijing, China, Oct. 19-24 2009, 10 pages.
D. T. Murphy and D. M. Howard, "Modeling and Directionally Encoding the Acoustics of a Room," Elect. Lett., vol. 34, No. 9, pp. 864-865, Apr. 1998, 2 pages.
S. A. Van Duyne and J. O. Smith, III, "The Tetrahedral Digital Waveguide Mesh," in Proc. of 1995 IEEE Workshop on Appl. of Signal Process. to Audio and Acoust. (WASPAA '95), New Paltz, NY, USA, Oct. 15-18, 1995, pp. 234-237, 4 pages.
L. Savioja and V. Valimaki, "Reducing the Dispersion Error in the Digital Waveguide Mesh Using Interpolation and Fequency-Warping Techniques," IEEE Trans. on Speech and Audio Process., vol. 8, No. 2, Mar. 2, 2000, 11 pages.
L. Savioja, "Real-Time 3D Finite-Difference Time-Domain Simulation of Low-and Mid-Frequency Room Acoustics," in Proc. 13th Int. Conf. on Digital Audio Effects (DAFx-10), Graz, Austria, Sep. 2010, 8 pages.
W. G. Gardner, "Reverberation Algorithms," in Applications of Digital Signal Processing to Audio and Acoustics, M. Kahrs and K. Brandenburg, Eds., Boston, MA, USA, 1998, pp. 85-131, Kluwer Academic, 47 pages.
D. Rocchesso, Circulant and Elliptic Feedback Delay Networks for Artificial Reverberation, IEEE Trans. on Speech and Audio Process., vol. 5, No. 1, pp. 51-63, Jan. 1997, 13 pages.
S. Mate-Cid, H. Hacihabiboglu, and Z. Cvetkovic, "Stereophonic Rendering of Source Distance using DWM-FDN Artificial Reverberators," in Proc. 128th Conv. of the Audio Eng. Soc., Preprint #8030, London, UK, May 22-25, 2010, 11 pages.
J. O. Smith, III, "A New Approach to Digital Reverberation using Closed Waveguide Networks," in Proc. 11th Int. Comput. Music Conf., Burnaby, BC, Canada, 1985, pp. 47-53, 7 pages.
M. Karjalainen, P. Huang, and J. O. Smith, "Digital Waveguide Networks for Room Response Modeling and Synthesis," in Proc. 118th Conv. Audio Eng. Soc., Preprint # 6394, Barcelona, Spain, 2005, 18 pages.
A. Kelloniemi, V. Valimaki, and L. Savioja, "Simulation of Room Acoustics using 2-D Digital Waveguide Meshes," in Proc. of IEEE Int. Conf. Acoust., Speech and Signal Process. (ICASSP), 2006, IEEE, 2006, vol. 5, 4 pages.
H. Hacihabiboglu, B. Gunel, and Z. Cvetkovic, "Simulation of Directional Microphones in Digital Waveguide Mesh-Based Models of Room Acoustics," IEEE Trans. on Audio, Speech and Language Process, vol. 18, No. 2, pp. 213-223, Feb. 2010, 11 pages.
J-M. Jot and A. Chainge, "Digital Delay Networks for Designing Artificial Reverberators," in Proc. 104th Conv. Audio Eng. Soc., Preprint # 3030, Paris, France, 1991, 16 pages.
J. Stautner and M. Puckette, "Designing Multichannel Reverberators," Computer Music J., vol. 6, No. 1, pp. 52-65, 1982, 14 pages.
C. Faller and F. Menzer, "Unitary Matrix Design for Diffuse Jot Reverberators," in Proc. 128th Conv. Audio Eng. Soc., Preprint # 7984, London, UK, 2010, 16 pages.
M. R. Schroeder, "Natural Sounding Artificial Reverberation," J. Audio Eng. Soc., vol. 10, No. 3, pp. 219-223, 1962, 5 pages.
J. Huopaniemi, L. Savioja, and M. Karjalainen, "Modeling of Reflections and Air Absorption in Acoustical Spaces—A Digital Filter Design Approach," in Proc. 1997 IEEE Workshop on Appl. of Signal Process. to Audio and Acoust. (WASPAA '97), New Paltz, NY, USA, Oct. 19-22, 1997, 4 pages.
H. Kuttruff, "Room Acoustics," Chapter 5, "Reverberation and Steady State Energy Density," SPON Press, London, UK, 4th edition, 2000, pp. 115-130, 17 pages.
C. F. Eyring, "Reverberation Time in "Dead" Rooms," J. Acoust. Soc. Am., vol. 1, p. 168, 1930, 1 page.
International Standards Organization, "3382. Acoustics-Measurement of the reverberation time of rooms with reference to other acoustical parameters," 1997, 28 pages.
M. Zyda, "From Visual Simulation to Virtual Reality to Games," Computer, vol. 38, No. 9, pp. 25-32, Sep. 2005, 8 pages.
V. Valimaki, J. Parker, and J. S. Abel, "Parametric Spring Reverberation Effect," J. Audio Eng. Soc., vol. 7/8, No. 58, pp. 547-562, Jul./Aug. 2010, 16 pages.
M. R. Schroeder and B. F. Logan, "Colorless Artificial Reverberation," IRE Transactions on Audio, vol. AU-9, pp. 209-214, 1961, 6 pages.
J. A. Moorer, "About This Reverberation Business," Computer Music Journal, vol. 3, No. 2, pp. 13-28, 1979, 16 pages.
M. A. Gerzon, "Ambisonics in Multichannel Broadcasting and Video," J. Audio Eng. Soc., vol. 33, No. 11, pp. 859-871, Nov. 1985, 13 pages.
M. M. Boone, E. Verheijen, and P. Van Tol, "Spatial Sound-Field Reproduction by Wave-Field Synthesis," J. Audio Eng. Soc., vol. 43, No. 12, Dec. 1995.
H. Moller, "Fundamentals of Binaural Technology," App. Acoust., vol. 36, No. 3-4, pp. 171-218, 1991, 48 pages.
E. Scheirer, R. Vaananen, and J. Huopaniemi, "AudioBIFS: Describing Audio Scenes with the MPEG-4 Multimedia Standard," Multimedia, IEEE Transactions on, vol. 1, No. 3, pp. 237-250, Sep. 1999, 14 pages.
E. De Sena, H. Hac1habiboglu, and Z. Cvetkovic, "Scattering Delay Network: An Interactive Reverberator for Computer Games," in Proc. of AES 41st Int. Conf. on Audio for Games, London, UK, 2011, 11 pages.
H. Hacihabiboglu, B. Gunel, and F. Murtagh, "Wavelet-Based Spectral Smoothing for Head-Related Transfer Function Filter Design," in Proc. of the 22nd AES Conference on Virtual, Synthetic and Entertainment Audio, Espoo, Finland, Jun. 2002, pp. 131-136, 6 pages.

* cited by examiner

ELECTRONIC DEVICE WITH DIGITAL REVERBERATOR AND METHOD

BACKGROUND OF THE INVENTION

1. Field of the Invention

The present invention relates to an electronic device comprising a digital reverberator, to a computer-readable memory storing a digital reverberator, and to a method of digital sound reproduction using a digital reverberator for a user of an electronic device.

2. Description of Related Art

Advances in computational hardware have made virtual reality (VR) a ubiquitous technology, especially in computer games (many of which are now being released in '3D' to further enhance realism). The user-perceived realism of a virtual reality application depends on its design, which must take into account several different output modalities such as visual, auditory, and tactile. Along with realistic graphics rendering, spatial audio is one of the most important factors that affect how realistic its users perceive a virtual environment or a computer game [see M. Zyda, "From visual simulation to virtual reality games", Computer, vol. 38, no. 9, pp. 25-32, September 2005, the contents of which are fully incorporated herein by reference]. While spatial audio is well-established, especially in music reproduction and movies, VR applications and computer games have been relatively slow in taking up the available technology. This is especially so with room acoustics simulators, also known as digital reverberators: such reverberators are computer-implemented and are able to determine how a sound source is heard in an enclosure, such as a room, a maze, or a hall. The reason for this slow uptake is the computational complexity of accurate room acoustics simulators which make interactivity infeasible, if not impossible on consumer-grade electronic devices, such as gaming machines including, but are not limited to, the XBOX 360®, PLAYSTATION 3®, desktop PCs, laptops, notebooks, tablets (e.g. IPAD®), and Smartphones. Therefore, the spatial audio effects that can be provided by conventional electronic devices have remained rather rudimentary.

The primary aim of a digital reverberator is to emulate the response of a virtual room given the parameters such as room geometry, source and receiver positions and directivity patterns, and absorption and diffusion characteristics of room surfaces [see M. Vorlander, *Auralization—Fundamentals of Acoustics, Modeling, Simulation, Algorithms and Acoustic Virtual Reality*. Springer-Verlag, 2008, the contents of which is fully incorporated herein by reference]. This process is known as 'room auralization'. A room is a multipath environment and a room impulse response (RIR) typically consists of the direct path, early reflections, and late reverberation. For a listener positioned in a room, the early portion of RIR determines the perceived width of the source and the late portion determines how distance of a sound source and the size of a room are perceived. If multiple receivers are used, RIRs can also inform a listener about the relative direction of a sound source.

Artificial reverberation is a technique that has been used to improve the spatial sound quality of a recorded sound for a user. Initially the reverberation was applied to the sound as it was recorded. For example, the earliest artificial reverberators were electromechanical devices such as plates or springs and were used to improve spatial realism of studio recordings prior to radio broadcast. However, advances in digital systems and digital signal processing algorithms opened up the possibility of applying digital artificial reverberation (or more simply 'digital reverberation') to a sound as it was played back to the user. In this way it was possible to change the user's perception of the sound, and this became particularly important for imparting realism to computer games and virtual reality, especially games of the first-person shooter type.

One of the most well-known digital artificial reverberators was Schroeder reverberator [see for example M. R. Schroeder and B. F. Logan, "Colorless artificial reverberation," *IRE Transactions on Audio*, vol. AU-9, pp. 209-214, 1961] which consisted of parallel comb filters and allpass filters connected in cascade. Comb filters model frequency modes of a room transfer function and allpass filters increase the reflection density which is necessary to obtain a rich reverberation tail. Whilst Schroeder reverberators generate colorless reverberation, they also cause metallic ringing artifacts, especially for long reverberation times. This issue was addressed by Moorer [see J. A. Moorer, "About this reverberation business," *Computer Music Journal*, vol. 3, no. 2, pp. 13-28, 1979] by inserting a lowpass filter in the feedback path of comb filters. However, neither Schroeder nor Moorer reverberators allow explicit control over the frequency-dependent reverberation time. This problem was addressed by Gardner [see W. G. Gardner, "Reverberation algorithms," in *Applications of Digital Signal Processing to Audio and Acoustics*, M. Kahrsand K. Brandenburg, Eds. Boston, Mass., USA: Kluwer Academic, 1998, pp. 85-131] by adding a global lowpass feedback path to the cascade of allpass filters.

One of the most commonly used digital artificial reverberators today is the feedback-delay network (FDN) [see J. Stautner and M. Puckette, "Designing multichannel reverberators," *Computer Music J.*, vol. 6, no. 1, pp. 52-65, 1982, the contents of which is fully incorporated herein by reference] that was proposed as a multichannel extension of the Schroeder reverberator. FDN reverberators consist of parallel delay lines connected recursively over a unitary (i.e. energy preserving) feedback matrix. FDN-type reverberators were improved by Jot and Chaigne [see J.-M. Jot and A. Chaigne, "Digital delay networks for designing artificial reverberators," in *Proc. 104th Conv. Audio Eng. Soc., Preprint* #3030, Paris, France, 1991, the contents of which is fully incorporated herein by reference], who used delay lines connected in series with absorptive filters, and a global tonal correction filter to obtain a frequency-dependent reverberation time. Investigation of matrices that provide maximum scattering is a matter of on-going research [see C. Faller and F. Menzer, "Unitary matrix design for diffuse jot reverberators," Presented at 128th Audio Engineering Society Convention, Preprint #7984, May 2010]. Another type of artificial reverberator related to FDN is based on the concept of digital waveguides, and is called the digital waveguide network (DWN) [see J. O. Smith, III, "A new approach to digital reverberation using closed waveguide networks," in *Proc. 11th Int. Comput. Music Conf.*, Burnaby, BC, Canada, 1985, pp. 47-53, the contents of which is fully incorporated herein by reference]. Such reverberators were more formally investigated by Karjalained et. al. [see M. Karjalainenet al. "Digital Waveguide Networks for Room Response Modeling and Synthesis," in *Proc. 118th Conv. Audio Eng. Soc., Preprint* #6394, Barcelona, Spain, 2005, the contents of which is fully incorporated herein by reference] for rectangular enclosures.

Recent advances in multicore processors, and more particularly general purpose graphical processing units (GPGPU) have made it possible to use full scale, real-time, interactive room simulators in computer games and VR applications. However, such algorithms are still impractical for all kinds of consumer-grade electronic devices, and especially low-cost and low-power portable terminals such as, but not limited to: tablet computers, portable game consoles and mobile/smart phones.

For example, a full scale VR suite such as a CAVE Automatic Virtual Environment (CAVE) can use Ambisonics [see M. A. Gerzon, "Ambisonics in multichannel broadcasting and video," *J. Audio Eng. Soc.*, vol. 33, no. 11, pp. 859-871, November 1985, the contents of which is fully incorporated herein by reference] or wave field synthesis (WFS) which requires from tens to hundreds of loudspeaker channels [see M. M. Boone, U. Horbach, and W. P. J. Bruijn, "Spatialsound-field reproduction by wave-field synthesis," *J. Audio Eng. Soc.*, vol. 43, no. 12, pp. 1003-1012, December 1995]. In contrast, a portable game console will have two channel audio output which may be used to output binaural audio [see H. Møller, "Fundamentals of binaural technology," *Appl. Acoust.*, vol. 36, no. 3-4, pp. 171-218, 1991, the contents of which is fully incorporated herein by reference] over headphones. On the other hand a typical home user will probably use a 5.1 or a 7.1 audio system or more possibly a stereophonic system with two channels of audio output.

As mentioned above, an artificial digital reverberator was proposed by Smith [see J. O. Smith, III, "A new approach to digital reverberation using closed waveguide networks," in *Proc. 11th Int. Comput. Music Conf.*, Burnaby, BC, Canada, 1985, pp. 47-53].

U.S. Pat. No. 4,984,276 (also to Smith) discloses is a signal processor formed using digital waveguide networks. The digital waveguide networks have signal scattering junctions. A junction connects two waveguide sections together or terminates a waveguide. The junctions are constructed from conventional digital components such as multipliers, adders, and delay elements. The signal processor is typically used for digital reverberation and for synthesis of reed, string or other instruments.

These digital reverberators were further developed by Karjalainen et al. [see M. Karjalainen, P. Huang, and J. O. Smith, "Digital Waveguide Networks for Room Response Modeling and Synthesis," in *Proc. 118th Cony. Audio Eng. Soc., Preprint* #6394, Barcelona, Spain, 2005] in order to produce a maximally efficient simulation of acoustic space. Karjalainen et al. proposed a so-called 'sparse' digital waveguide network having one (or a few) scattering junction per simulated wall; the scattering junctions are interconnected by digital waveguides (i.e. a respective bi-directional delay line). The network is lossless, except for wave digital admittances applied at each scattering junction. The digital admittances start and terminate on a respective scattering junction and therefore appear diagrammatically as a loop. Whilst the sparse network is reasonably computationally efficient (reported as taking 15% of CPU time on a 1 GHz G4 PowerPC process with single simulated source and receiver), the authors admit that tuning of model parameters involves much guesswork, and relies on actually listening to the simulated room, adjusting parameters and listening again; this process is repeated until a satisfactory sound simulation is perceived.

This is a significant problem because it prevents the sparse digital waveguide network being used in all but the simplest of cases. For example, many interactive computer games involve tens or hundreds of acoustic spaces (rooms, street scenes, etc.). It is completely impractical for computer game developers to manually configure each space for all possible positions of source and receiver (e.g. player position within the space).

It is apparent that there is a need for a digital reverberator, for example of the sparse digital waveguide network type, but which can be readily implemented in computer game and virtual reality environments, without the need to manually tune model parameters for each room. Furthermore, it would be preferable if such a reverberator is operable in real-time on consumer-grade computer devices so that other critical game or simulation features (e.g. graphics processing) are not unduly compromised.

SUMMARY OF THE INVENTION

Certain embodiments disclosed herein are based on the insight that surface sound reflection characteristics can be simulated in a virtual room or space directly through the coefficients of a digital surface absorption filter by placing that filter in a digital reverberator so that the filter acts only once on each digital audio data sample each time it is reflected from a virtual surface of the virtual room that is to be simulated. In this way, surface sound reflection characteristics (for example those of real or artificial surfaces that have been measured experimentally; alternatively surfaces with theoretical properties can also be implemented) can be readily used by software developers (e.g. computer game or virtual reality developers), without the need for heuristic tuning of the digital reverberator for every virtual room. By way of example, if a software developer is designing a room for a game and selects a surface to be constructed of brick, for example, a digital surface absorption filter is configured with filter coefficients that approximate the real sound absorption coefficients known about brick surfaces. The filter coefficients can be optimized for each known surface (e.g. wall/floor/ceiling/object) material using, for example, a damped Gauss-Newton or Yule-Walker method to fit the digital surface absorption filter response to the real or theoretical response (other optimization methods will be apparent to the skilled person). Furthermore this optimization process need only be done once for each surface (e.g. wall/floor/ceiling/object) material; once done the filter coefficients may be stored directly in game development software and called upon each time they are required by the developer. Ultimately, each virtual surface in the computer game may have an associated digital surface absorption filter as part of the computer game data. When the user plays the game, real-time digital reverberation can be performed on game sounds in different rooms and spaces of the game, improving the realism for the user.

Embodiments of the digital reverberator are not limited to computer game and virtual reality applications. For example, in certain aspects, the digital reverberator can be incorporated into any electronic device that processes digital audio data samples to provide an artificial digital reverberation effect for a user, the data samples either processed in real-time by the reverberator, or processed by the reverberator and then stored in electronic memory for subsequent playback. Embodiments of the digital reverberator may also be provided in the form of a DSP board, Application Specific Integrated Circuit (ASIC) or Field Programmable Gate Array (FPGA).

Other embodiments disclosed herein are based on the insight that it is preferable to prioritize the accuracy of the simulated first-order reflection over later stage reverberation in a digital reverberator. This can be achieved by application of a gain on a path between a source injection node and a receiver node (the path corresponding to the path of the first-order reflection), in which the gain approximates a 1/r attenuation, where r is distance along the path between the source injection and receiver nodes. It has been found that this method simulates quite accurate first-order reflections without compromising later stage reverberation.

Other embodiments disclosed herein are based on the insight that the receiver node in a network of scattering junctions should not take an active part in the reverberating part of the digital reverberator. Instead the receiver node is connected to the network of scattering junctions by unidirectional delay lines. In this way the computational overhead is reduced and the receiver node in the sparse DWN behaves more like a real receiver registering a sound in a room.

DESCRIPTION OF THE PREFERRED EMBODIMENT(S)

In order to give a better understanding of the preferred embodiments, a brief background of digital waveguide mesh models and feedback delay networks is given below.

Digital Waveguide Mesh Models

Figure 1:
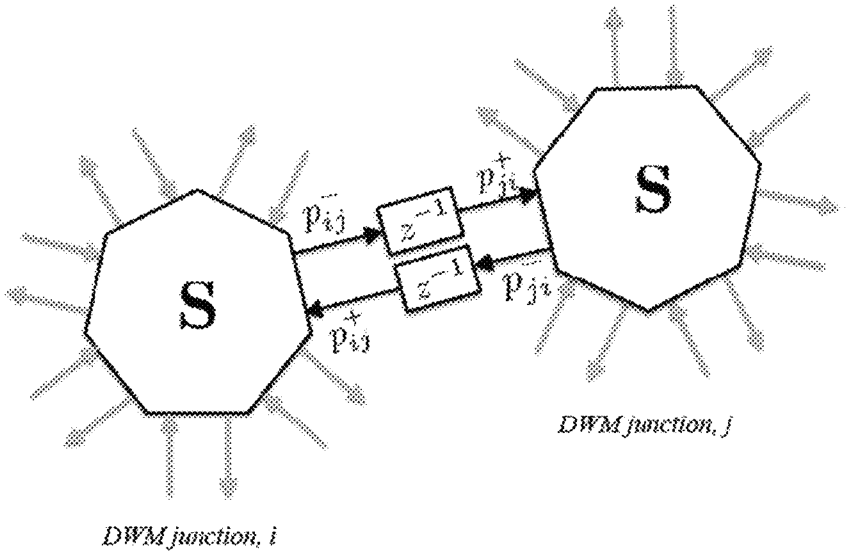
FIG. 1 is a schematic diagram of two interconnected DWM junctions of the prior art.

Digital waveguide meshes (DWM) are simple numerical models that can be used to solve wave equation in acoustic media [see S. D. Bilbao, *Wave and scattering methods for numerical simulation*, Wiley, 2004]. DWM models involve sampling of the domain whose acoustics is to be modeled. Each sample in the DWM model is represented by an N-port scattering junction, connected to its geometric neighbors over bidirectional delay lines. Execution of a DWM model involves two successive stages at each iteration: the scattering pass, and the propagation step. The solution of the wave equation is obtained during the scattering pass by a simple matrix operation and the obtained solution is propagated in the model at the propagation stage. In order to demonstrate this operation let us consider the interconnected DWM junctions shown in FIG. 1.

At a given iteration, n, the outgoing wave variables $p_i^-(n)$ at junction i are obtained from incoming wave variables $p_i^-(n)$ by the scattering pass which involves the matrix multiplication:

$$p_i^-(n)=Sp_i^+(n) \tag{1}$$

where $$p_i^+(n) = [p_{i1}^+(n) \ \dots \ p_{ij}^+(n) \ \dots \ p_{iN}^+(n)]^T,$$

$$p_i^-(n) = [p_{i1}^-(n) \ \dots \ p_{ij}^-(n) \ \dots \ p_{iN}^-(n)]^T,$$

$$S = \frac{2}{N} 1_{N\times N} - I,$$

are the incoming and outgoing wave variable vectors, and the scattering matrix, respectively. This operation is called the scattering pass. The calculated outgoing wave variables are then propagated throughout the model by the bidirectional delay lines such that $p_{ij}^+(n+1)=p_{ij}^-(n)$. This step is called the propagation step. These two steps allow the calculation of the response at each point in the modeled acoustical system.

Room acoustics can be modeled with two [see A. Kelloniemi, V. Valimaki, and L. Savioja, "Simulation of room acoustics using 2-D digital waveguide meshes," in *Proc. of IEEE Int. Conf. Acoust., Speech and Signal Process*. (*ICASSP*), 2006. IEEE, 2006, vol. 5, the contents of which are fully incorporated herein by reference] or three [see H. Hacihabiboğlu, B. Günel, and Z. Cvetković, "Simulation of directional receivers in digital waveguide mesh-based models of room acoustics," *IEEE Trans. on Audio, Speech and Language Process*, vol. 18, no. 2, pp. 213-223, February 2010, the contents of which are fully incorporated herein by reference] dimensional DWM models. However, the associated computational load is prohibitively high for real-time operation. Advances in multicore graphical processing units (GPUs) made fast implementations of DWMs possible. However, DWMs are still confined to high-end systems with specialized hardware and require a considerable amount of memory. For example modeling a 6.2 m by 4.7 m by 7.1 m virtual room with a rectilinear digital waveguide mesh at a sampling frequency of 44.1 KHz would require a dynamic memory resources 2.2 GB. That resource allocation is typically not practical in real-time for consumer-grade electronic devices.

Feedback Delay Networks

Feedback delay networks (FDN) were first proposed by Stautner and Puckette as a multichannel generalization of recursive reverberators [J. Stautner and M. Puckette, "Designing multichannel reverberators," *Computer Music J.*, vol. 6, no. 1, pp. 52-65, 1982, the contents of which are fully incorporated herein by reference]. The original model was based on a so-called 'lossless' prototype which used a unitary feedback matrix, A (i.e. $AA^T=I$) in the feedback path connected onto itself by delay lines in the feed-forward path. This way, N reverberated signals could be obtained from N independent inputs to be played back over an N-channel audio system or mixed to obtain any desired number of channels. The feedback matrix is not unique and can be selected to be any unitary matrix, but with varying results [C. Faller and F. Menzer, "Unitary Matrix Design for Diffuse Jot Reverberators," in *Proc. 128th Conv. Audio Eng. Soc., Preprint* #7984, London, UK, 2010, the contents of which are incorporated herein by reference]. For example if the N×N feedback matrix A=I the FDN structure can be simplified to N comb filters connected in parallel and acts as the Schroeder reverberator [M. R. Schroeder, "Natural-sounding artificial reverberation, "*J. Audio Eng. Soc.*, vol. 10, no. 3, pp. 219-233, 1962, the contents of which are herein incorporated by reference].

Figure 2:
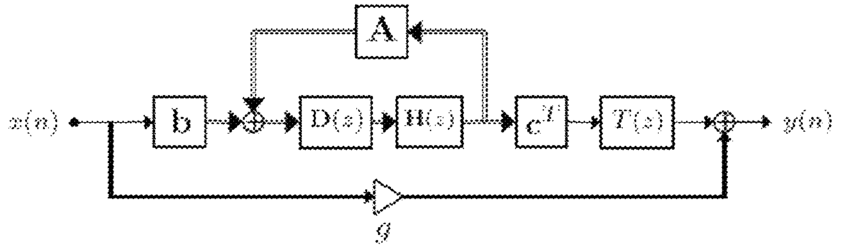
FIG. 2 is a block diagram of a prior art reverberator proposed by Jot and Chaigne.

1. Jot and Chaigne proposed an improved version of FDN reverberators by including absorbent filters on each feedforward path as well as a tone correction filter [see J-M. Jot and A Chaigne, "Digital delay networks for designing artificial reverberators," in *Proc.* 104*th Conv. Audio Eng. Soc., Preprint* #3030, Paris, France, 1991]. FIG. 2 shows the block diagram of this reverberator. It is possible using this reverberator to control the modal decay characteristics of the reverberant time, but in an indirect way. The transfer function of this reverberator can be expressed as (where A is the unitary feedback matrix, $b_i$ is the input gain, $c_i$ is the output gain, $m_i$ is the integer delay, and $H_i(z)$ is the absorbent filter associated with channel i, and T(z) is the tone correction filter):

$$Y(z)=T(z)c^Tq(z)+gX(z), \quad (2)$$

$$q(z)=H(z)D(z)[Aq(z)+bX(z)]. \quad (3)$$

Here, $$q(z)=[s_1(z)s_2(z) \ldots s_N(z)]^T$$

is the state vector, $$b=[b_1b_2 \ldots b_N]^T,$$

$$c=[c_1c_2 \ldots c_N]^T,$$

are the gain vectors, $$H(z)=\mathrm{diag}(H_1(z), H_2(z), \ldots, H_N(z)),$$

is the absorptive filter matrix, $$D(z)=\mathrm{diag}(z^{-m_1}, z^{-m_2}, \ldots, z^{-m_N}),$$

is the delay matrix, A is a unitary feedback matrix, and g is the gain of the direct path. The frequency response of this multichannel system can be expressed as:

$$H(z)=\frac{Y(z)}{X(z)}=T(z)c^T[H(z^{-1})D(z^{-1})-A]^{-1}b+g. \quad (4)$$

An interesting aspect of FDN-type reverberators is their similarity with DWM models [see D. Rocchesso, "Circulant and elliptic feedback delay networks for artificial reverberation," IEEETrans. on Speech and Audio Process., vol. 5, no. 1, pp. 51-63, January 1997 the contents of which are fully incorporated herein by reference]. Namely, each DWM junction is a special case of an FDN reverberator, making a multidimensional DWM a network of interconnected FDN reverberators. This similarity manifests itself in the fact that both DWM junctions and FDN-type reverberators carry out a scattering operation with unitary matrices. In the case of a densely sampled DWM, the actual solution of the wave equation is obtained. In the case of an FDN reverberator, the reverberation characteristics of a room are emulated without any consideration of physical accuracy. This similarity was previously exploited to obtain a simple two-channel reverberator [see the aforementioned paper by Jot and Chaigne mentioned immediately above].

Figure 3:
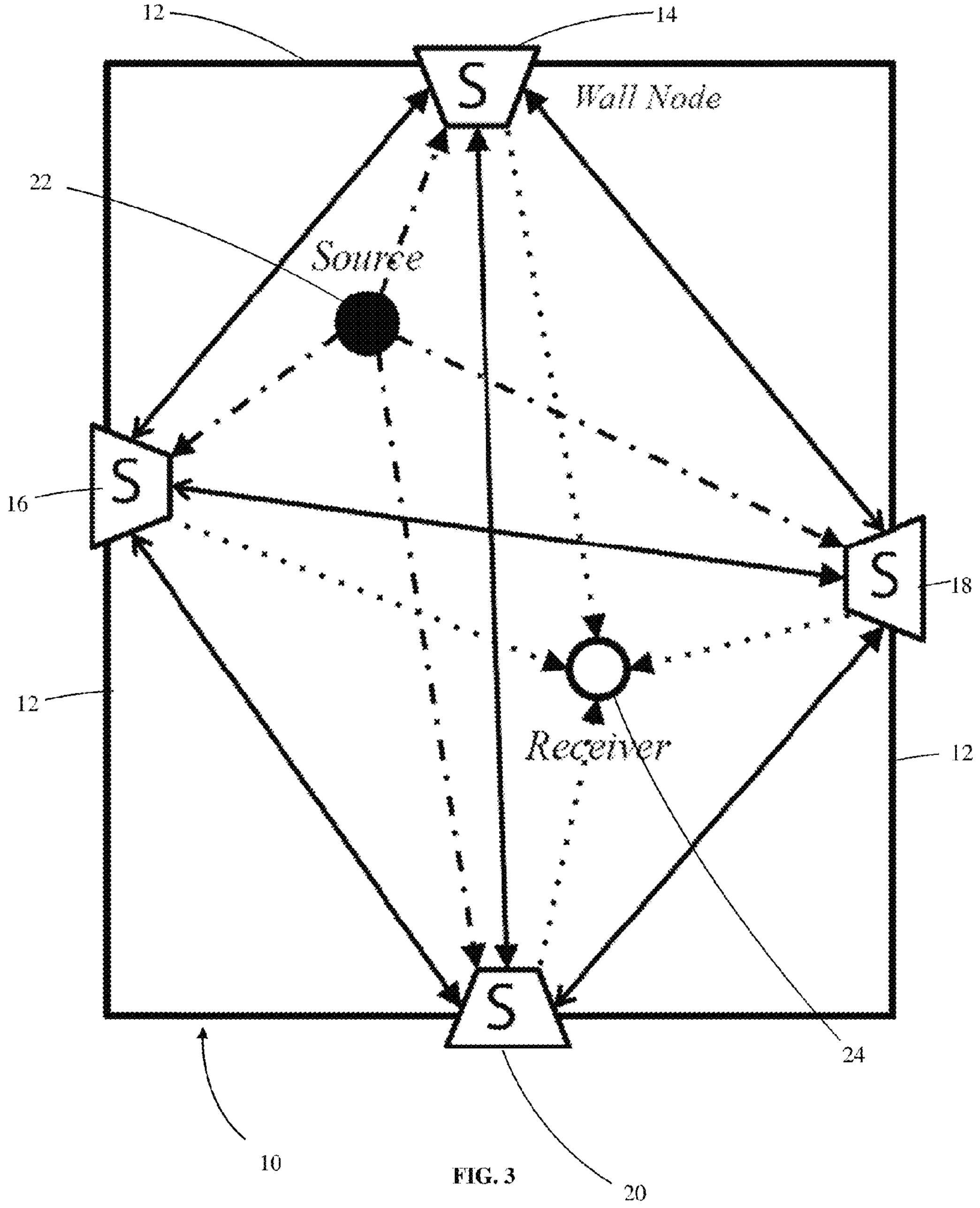
FIG. 3 is a conceptual block diagram of one embodiment of a digital room reverberator.

With reference to FIG. 3, a conceptual diagram of a digital reverberator is generally identified by reference numeral 10. In this embodiment, the modeled enclosure is a rectangular virtual room having four virtual surfaces 12 (walls in this particular embodiment). As such this is a 2D case, and it will be appreciated that the model can be extended to a 3D case by including a floor and a ceiling, and optionally more than four surfaces. In this embodiment there is one junction 14, 16, 18, 20 per surface (e.g. wall). Whilst preferred embodiments of the digital reverberator of the present invention comprise one junction (or scattering node) for each surface of a modeled enclosure, it is conceivable to provide more than one junction per surface.

Each junction is connected to each other junction via a respective bidirectional, absorptive delay line (solid black lines with arrow heads). Each bidirectional delay line comprises an incoming and outgoing delay line, it being appreciated that 'outgoing' and 'incoming' must be seen from the point of view of one junction. The bidirectional delay lines form digital reverberation network and this is the part of the network around which sound energy reverberates and decays. A source injection node 22 is connected to each junction by a respective source unidirectional attenuating delay line (dot-dash line with arrow head). A receiver node 24 is connected to each junction by a respective receiver unidirectional attenuating delay line (dotted line with arrow head). The direct path (or line-of-sight) is modeled by a connection between the source injection node 22 and the receiver node 24 (however, this is not shown in FIG. 3). Due to the nature of the operations carried out to obtain reverberation (as described in greater detail below), we have called this digital reverberator a scattering delay network (SDN) reverberator and hereinafter the junctions 14, 16, 18, 20 will be referred to as 'SDN nodes', although no change in meaning is intended.

Typically, the digital reverberator 10 is stored as a set of computer-executable instructions in non-volatile memory (e.g. hard-drive or solid state memory) or volatile memory (e.g. RAM) of an electronic device, such as a consumer-grade electronic device, such as, but not limited to, a computing device (such as a DSP, DSP board, ASIC, FPGA, or any kind of personal computer), and a playback device (such as a DVD player, Blu-ray player, and digital audio music player, such as an audio amplifier).

In some embodiments, the digital reverberator 10 may be stored and executed at a remote location from the user e.g. on a remote web server or the like. In preferred embodiments, the non-volatile memory of the electronic device stores the dimensions and one or more characteristic of each of the virtual surfaces 12, as well as the positions of the various nodes. Digital audio samples to be processed by the digital reverberator 10 may or may not be stored on the non-volatile memory of the electronic device. In some embodiments, the digital audio data is carried by external memory media (e.g. an optical disc storing computer game data). When inserted into the electronic device, the digital audio data can be read off the external memory media. In other embodiments, the digital audio data may be stored on the non-volatile memory of the electronic device, for example in the form of an 'app'. In yet other embodiments, the digital audio data may be stored remotely on a web server for example; the electronic device may have access to the web server via the Internet in order to download digital audio samples as required.

Consumer-grade electronic devices are capable of receiving and processing digital audio data for playback to the user. Typically the electronic device has a data input interface (hardware and/or software) through which digital audio data is passed from storage to the processor. Digital audio data may be in the form of a continuous stream of digital data, or as discrete samples of any length; the digital audio data may be retrieved from storage or generated in real-time for input into the digital reverberator. The digital audio data may be stored in any compressed or uncompressed format, for example as a WAV file. Under control of the electronic device, digital audio may be retrieved locally from non-volatile memory such as, but not limited to, optical media (e.g. CD-ROM, DVD) contained an optical drive (e.g. as on a games console during playing of a computer game), or may be received over a network connection from a remote location (e.g. downloaded from a web server accessible via the Internet, optionally stored locally, and converted for playback to the user).

During playback of the digital audio, digital samples are sent to a data output interface, and usually (but not always) converted to analogue with a digital-to-analogue converter or DAC (e.g. the data output interface may be a soundcard). One or more output analogue signal is provided which is passed to an amplifier (which may be integral or separate from the electronic device) and then on to a speaker of some kind (e.g. headphones, loudspeakers, surround sound systems, etc.). The digital audio data may comprise any number of channels.

Before passing the digital audio to the audio output interface, the electronic device is configured to pass digital samples through the digital reverberator 10. As mentioned above, the digital audio may have any number of channels e.g. mono, stereo, surround sound (such as provided by some of the DOLBY® formats). The digital reverberator 10 is also pre-configured with the type of sound system that the user has; this could be achieved using an on-screen menu or LCD display for example. The user might be using stereo headphones, a multichannel sound system, or integrated loudspeakers on the electronic device for example. Before entering the digital reverberator 10, the electronic device generates a number of channels from the digital audio which is equal to the number of channels of the user's sound system. Once the electronic device has retrieved or accessed a digital audio sample, data from the sample is input into the digital reverberator 10 via the source injection node 22, and is processed by the digital reverberation network as described below. After processing the digital reverberator 10 produces a digital audio output signal (comprising one or more channels) from the receiver node 24 which is sent to the data output interface (e.g. sound card or other amplifier) for auralization.

Referring again to FIG. 3 there are four types of connections in the digital reverberator 10. These are the connections between SDN nodes 14, 16, 18 20, source injection node 22 and SDN nodes, SDN nodes and receiver node 24, and source injection node 22 and receiver node 24. Each of these connections will be described in turn below.

SDN Node Operation

Each SDN node 14, 16, 18, 20 is positioned on a respective surface of the modeled enclosure (i.e. virtual room) at or near the point where sound is first reflected (after leaving the source injection node 22) in a direction toward the receiver node 24. This point can be determined geometrically (described in greater detail below). Each SDN node 14, 16, 18, 20 is connected to other nodes by a respective absorptive bidirectional delay line. Each SDN node carries out a scattering operation on its inputs from other SDN nodes to obtain outputs. This scattering operation is carried out using a unitary (i.e. energy preserving) scattering matrix. For a room with N surfaces, the number of neighbors that a SDN node has is N−1. The scattering matrix employed is:

$$S = \frac{2}{N-1} 1_{(N-1)\times(N-1)} - I, \tag{5}$$

which is common to all the SDN nodes in the reverberator. While results presented in this paper were obtained with (5), other unitary matrices could be used as well (for example any permutation matrix or any rotation matrix). The pressure at the SDN node is a combination of incoming wave variables, $P_{ki}^{+}(n)$, from neighboring nodes and the pressure, $p_{Sk}(n)$, due to the source as observed at the node:

$$p_k(n) = p_{Sk}(n) + \frac{2}{N-1} \sum_{i=1}^{N-1} p_{ki}^{+}(n). \tag{6}$$

In order to simplify the calculation, input from source can be distributed to incoming wave variables such that:

$$\tilde{p}_{ki}^{+}(n) = p_{ki}^{+}(n) + 0.5 p_{Sk}(n) \tag{7}$$

which provides the intended node pressure.

SDN Node Interconnections

Figure 4:
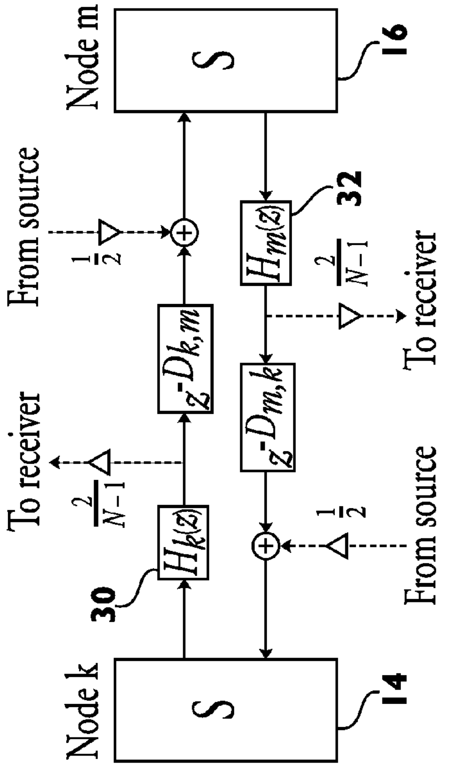
FIG. 4 is a schematic block diagram of the bidirectional connection between two SDN nodes.

As described above, the interconnections between the SDN nodes 14, 16, 18, 20 comprise one bidirectional delay line (which model the propagation path delay) between each pair of SDN nodes, and two digital surface absorption filters 30, 32 (one in each direction of a bidirectional delay line) which model the surface absorption associated with the two interconnected nodes. Due to their recirculating nature, the SDN node interconnections are responsible for the modeling of the room reverberation by facilitating the simulation of energy exchange between surfaces. An example of one connection between the SDN nodes 14 and 16 is depicted in FIG. 4. There is one digital surface absorption filter 30 and 32 in each direction; this brings the model closer to physical reality in which, for each reflection, sound is filtered only once by a surface. In this embodiment, each digital surface absorption filter 30 and 32 is positioned directly after the respective SDN node 14 and 16, but before the delay applied by the outgoing delay line. The same arrangement applies between all of the SDN nodes so that there is only one digital surface absorption filter in any given direction on a delay line. There are alternative positions for the digital surface absorption filters and these are described in greater detail below.

The length of the delay lines connecting the SDN nodes is determined by the actual positions of the SDN nodes. As mentioned above, SDN nodes are positioned to provide first-order early reflections having the correct delay and the correct angle of incidence at a receiver position at $x_M$ for a source positioned at $x_S$. This can be done by calculating the point at which a sound ray emitted from the sound source and received at the receiver hits the surface. This calculation is trivial.

For a volume with N surfaces, the number of bidirectional inter-node connections is $$\binom{N}{2}.$$

The length of the integer delay line between the k-th and m-th node is calculated as $D_{km}=F_s\|x_k-x_m\|/c$, where c is the speed of sound, $F_s$ is the sampling rate, and $x_i$ is the position vector of the i-th SDN node.

As explained above, the losses due to surface absorption can be incorporated into the model via digital surface absorption filters, $H_k(z)$ and $H_m(z)$ which model the absorptive properties of the surfaces, k and m, respectively. In certain embodiments each digital surface absorption filter comprises a stable minimum-phase IIR filter in order to reduce computational load without affecting the phase response of the simulated reflection. However, it is possible to use one or more FIR filter instead, or any combination of IIR and FIR filters, provided the model remains close to the physical reality i.e. sound filtered just once by each surface reflection.

The digital filter coefficients may be selected to adjust the frequency response of the digital filter so as to approximate the real frequency response of a real surface, floor or ceiling. This can achieved by a process of best fitting using the damped Gauss-Newton method for example. A better fit can be obtained by using higher order digital filters, but this must be balanced against increased computational overhead. The advantage of using digital filters in this way is that filter coefficients may be pre-configured in advance and made available in game developments software. Accordingly, when a game developer designs a virtual room or other space, the game software need only record the different types of material of the surfaces (e.g. wall, floor, ceiling, and/or objects) for each virtual room. Thus the game software may store virtual room profiles comprising identifiers of the surface materials and a central repository of digital filter coefficients for each surface material. It is then simply a matter of looking up the correct digital filter coefficients and applying them in the digital reverberator 10 during game play. Thus it is open to the game developer to design tens or hundreds of rooms, each with different acoustic responses, but without having to heuristically tune the digital reverberator to every virtual room.

In one embodiment, a digital surface absorption filter is a 3rd order IIR filter having 8 coefficients (4 feed-forward, and 4 feedback). This has been found to give a good balance between computational overhead and approximation to the real frequency-dependent characteristics of sound reflection from a surface (described in greater detail below). The order of the filter may be increased or decreased depending on expected processing capacity of the electronic device that will operate the digital reverberator 10.

Some examples of surface materials and corresponding IIR filter coefficients are given in the tables below. As explained above, these filter coefficients can be applied directly as the game developer selects surface materials during game development. The filter coefficients are stored as part of the computer game data so that they can be called by the user's electronic device as needed for sound simulation.

TABLE 1

Material: 6 mm pile carpet bonded to open-cell foam underlay

| Octave band frequency in Hz | Random-incidence absorption coefficients |
|---|---|
| 125 | 0.03 |
| 250 | 0.09 |
| 500 | 0.20 |
| 1k | 0.54 |
| 2k | 0.70 |
| 4k | 0.72 |
| 8k | 0.72 |

IIR filter numerator coefficients: [0.562666833756030 −1.032627191365576 0.469961155406544];
IIR filter denominator coefficients: [1.000000000000000 −1.896102349247713 0.896352947528892];

TABLE 2

Material: Surfaces, hard surfaces average (brick walls, plaster, hard floors, etc.)

| Octave band frequency in Hz | Random-incidence absorption coefficients |
|---|---|
| 125 | 0.02 |
| 250 | 0.02 |

TABLE 2-continued

Material: Surfaces, hard surfaces average (brick walls, plaster, hard floors, etc.)

| Octave band frequency in Hz | Random-incidence absorption coefficients |
|---|---|
| 500 | 0.03 |
| 1k | 0.03 |
| 2k | 0.04 |
| 4k | 0.05 |
| 8k | 0.05 |

IIR filter numerator coefficients: [0.978495798553620 −1.817487798457697 0.839209660516074]
IIR filter denominator coefficients: [1.000000000000000 −1.858806492488240 0.859035906864860]

TABLE 3

Material: Fissured ceiling tile

| Octave band frequency in Hz | Random-incidence absorption coefficients |
|---|---|
| 125 | 0.49 |
| 250 | 0.53 |
| 500 | 0.53 |
| 1k | 0.75 |
| 2k | 0.92 |
| 4k | 0.99 |
| 8k | — |

IIR filter numerator coefficients: [0.168413736374283 −0.243270224986791 0.074863520490536]
IIR filter denominator coefficients: [1.000000000000000 −1.845049094190385 0.845565720138466]

TABLE 4

Material: Cotton carpet

| Octave band frequency in Hz | Random-incidence absorption coefficients |
|---|---|
| 125 | 0.07 |
| 250 | 0.31 |
| 500 | 0.49 |
| 1k | 0.81 |
| 2k | 0.66 |
| 4k | 0.54 |
| 8k | 0.48 |

IIR filter numerator coefficients:
[0.687580695329600 −1.920746652319969 1.789915765926473 −0.556749690855965]
IIR filter denominator coefficients:
[1.000000000000000 −2.761840732459190 2.536820778736938 −0.774942833868750]

Alternative Positions for the Digital Surface Absorption Filters

FIGS. 4A-4E illustrate alternative positions for the digital surface absorption filters 30, 32. In each case, a digital sample is only filtered once by a digital surface absorption filter 30, 32 each time it is reflected from one of the surfaces 12. In each Figure the three lines from the left are incoming delay lines from junctions, 2, 3, 4 to the depicted junction (junction 1). The lines to the right are outgoing delay lines to the junctions 2,3,4. Hence the plot is somewhat graphically distorted for the purpose of clarity.

Figure 4A:
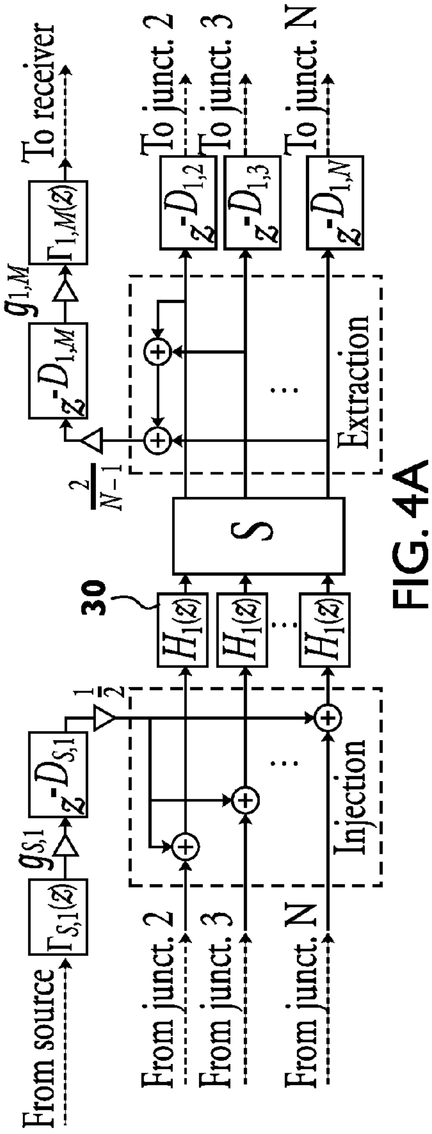

In FIG. 4A there is one digital surface absorption filter positioned in each incoming delay line of the digital reverberation network, after the delay applied by that incoming delay line.

Figure 4B:
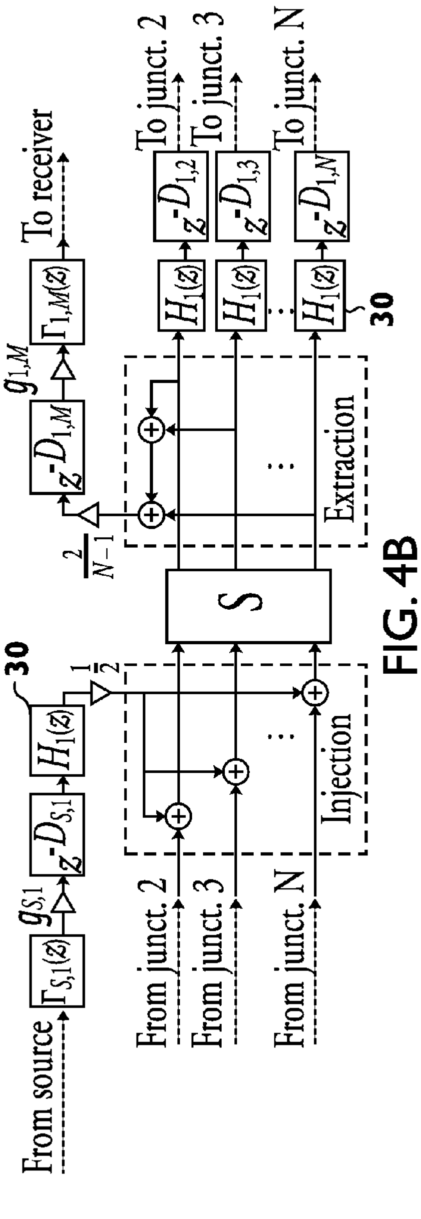

In FIG. 4B each source unidirectional delay line comprises one of the digital surface absorption filters, and the outgoing delay lines of the digital reverberation network each comprise a respective one of the digital surface absorption filters positioned after the extraction point on the respective outgoing delay line.

Figure 4C:
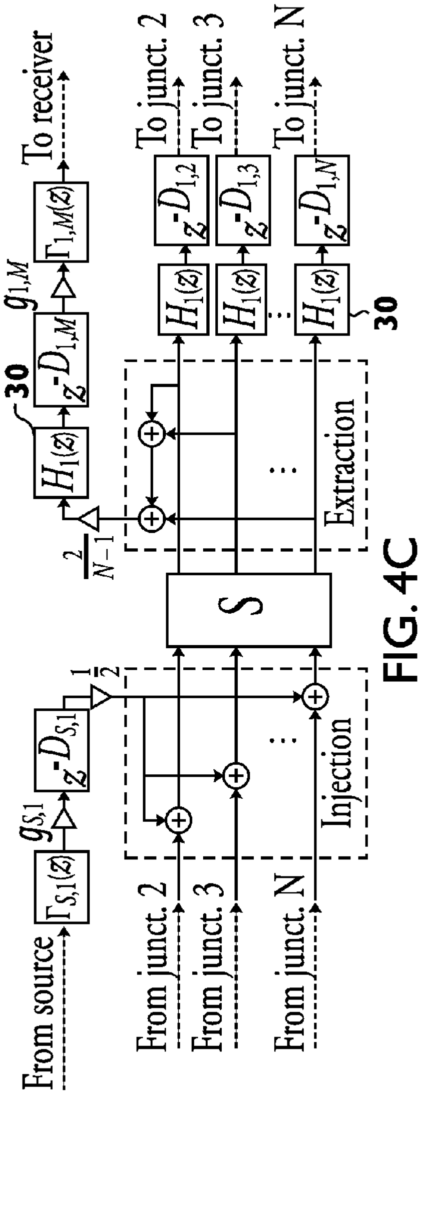

In FIG. 4C each receiver unidirectional delay line comprises one of the digital surface absorption filters, and the outgoing delay lines of the digital reverberation network each comprise a respective one of the digital surface absorption filters positioned after the extraction point on the respective outgoing delay line.

Figure 4D:
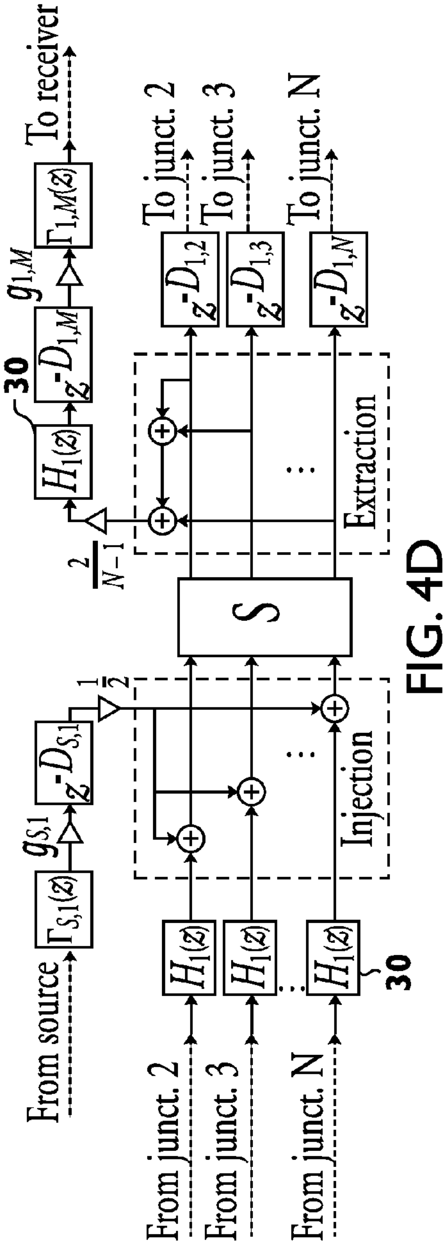

In FIG. 4D each receiver unidirectional delay line comprises one of the digital surface absorption filters, and the incoming delay lines of the digital reverberation network each comprise a respective one of the digital surface absorption filters positioned before the injection point on the respective incoming delay line.

Figure 4E:
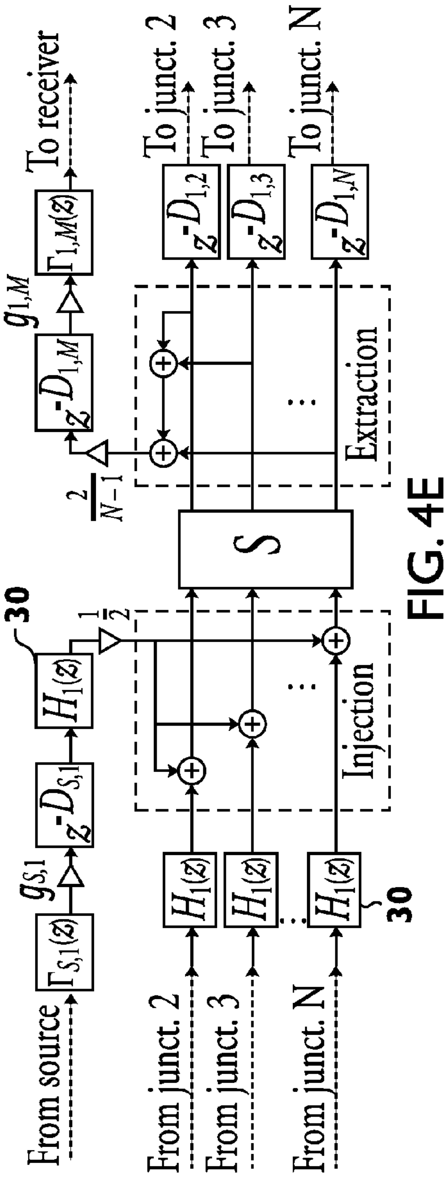

In FIG. 4E each source unidirectional delay line comprises one of the digital surface absorption filters, and the incoming delay lines of the digital reverberation network each comprise a respective one of the digital surface absorption filters positioned before the injection point on the respective incoming delay line.

Other equivalent structures can be obtained by inversion of appropriate pairs of operations. For instance, in 4A-4E the scattering operation can equivalently be carried out after the extraction operation. Similarly, in 4B-4E, the injection operation can follow the scattering operation.

Whilst the present embodiment of the digital reverberator comprises only IIR filters, it will be appreciated that other embodiments of the digital reverberator may comprise a combination of at least one IIR filter and at least one FIR filter, and other embodiments may comprise only FIR filter(s).

Position of SDN Nodes

In preferred embodiments, SDN nodes are positioned as close as possible to the point on each surface 12 where first-order reflection occurs. Whilst this gives the most accurate simulation of the first-order reflection, it is not essential that the SDN nodes be placed in these positions. For example, the SDN nodes could be moved slightly away from the first-order reflection position and still achieve a reasonable simulation. This is especially the case if the source and receiver are each omnidirectional. If the source has some directivity, positioning the SDNs close or at the first-order reflection points is more important but still not essential.

It would also be possible to add an SDN node at each second-order reflection point. However, it is expected that this would increase computational overhead considerably. Of course, as the computing power of consumer-grade electronic devices increases, this may become a more realistic possibility.

In certain aspects, a "first-order reflection" is the minimum-distance path between source and receiver nodes which bounces once off a surface. The point on the surface touched by the first-order reflection is called a "first-order reflection point".

Source to SDN Connections

As described above, the input to the digital reverberator 10 is in the form of a stream of digital audio data which is input into the source injection node 22. The source injection node 22 is connected to each of the SDN nodes 14, 16, 18, 20 via a respective unidirectional attenuating delay line (see dot-dash line in FIG. 3).

Figure 5:
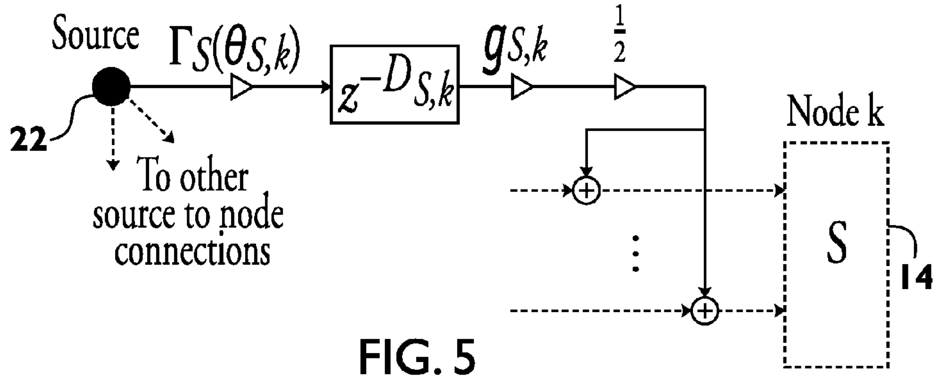
FIG. 5 is a schematic block diagram of the unidirectional connection between the source injection node and an SDN node.

With reference to FIG. 5 the connection between the source injection node 22 and the SDN node 14 is illustrated; the same connection is repeated between the source and each of the other SDN nodes 16, 18 and 20. The length of the delay line between the source at $x_S$ and the SDN node positioned at $x_k$ is determined by the propagation delay $D_{Sk}=F_s\|x_S-x_k\|/c$. As there is no backscattering to the source injection node or spreading of energy by the source injection node in the proposed model, the attenuation due to spherical spreading (1/r law) should also be incorporated into this delay line as $$g_{Sk}=\frac{G}{\|x_S-x_k\|},\qquad (8)$$

where G is the unit-distance in the model, i.e. $c/F_s$, where $F_s$ is the sampling frequency.

Another important simulation parameter is the source directivity. The sparse sampling of the simulated enclosure prohibits the simulation of source directivity in great detail. However, a coarse approximation is easily incorporated by weighting the outgoing signals by $\Gamma_S(\theta_{Sk})$, where $\Gamma_S(\theta)$ is the source directivity, and $\theta_{Sk}$ is the angle formed between the source reference axis and the line connecting source and k-th node. The pressure at the SDN node due to the source is then:

$$p_{Sk}(n)=g_{Sk}\Gamma_S(\theta_{Sk})p_S(n-D_{Sk}).\qquad (9)$$

This value is input to an SDN node by first scaling it with ½ and adding it to each incoming internode connection to the SDN node, as explained in equation (7).

SDN to Receiver Connections

Figure 6:
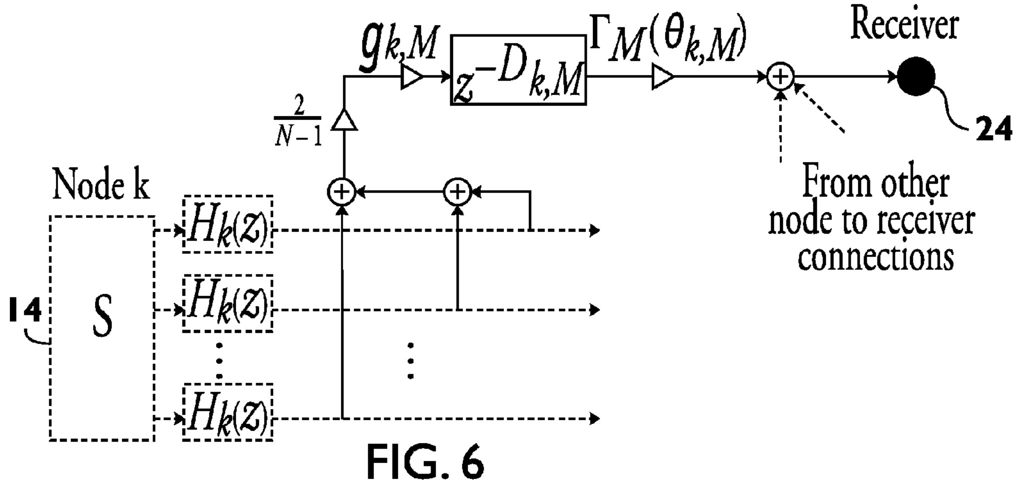
FIG. 6 is schematic block diagram of the unidirectional connection between an SDN node and the receiver node.

There is a respective unidirectional connection between each SDN node 14, 16, 18, 20 and the receiver node 24 which comprises an attenuating delay line. FIG. 6 shows an example of the connection between the SDN node 14 and the receiver node 24. It will be noted that the point of signal extraction (i.e. input to the delay line) is actually after the signal has passed through each digital surface absorption filter. In other words, the input end of the delay line is not connected directly to the SDN node, but is actually connected to the outgoing delay lines from each SDN node. The input signal to the delay line is taken as the summation of the outgoing pressure variables at the SDN node 14 after passing through the digital surface absorption filters multiplied by 2/(N−1). The delay from the k-th SDN node to the receiver node is $D_{kM}=F_s\|x_k-x_M\|/c$. As with source directivity, the receiver directivity can also be modeled using a direction-dependent gain element or a direction-dependent digital filter. The latter case would permit binaural reverberation. The attenuation on the delay line is set as:

$$g_{kM}=\frac{1}{1+\frac{\|x_k-x_M\|}{\|x_S-x_k\|}},\qquad (10)$$

such that $$g_{Sk}g_{Mk}=\frac{G}{\|x_S-x_k\|+\|x_k-x_M\|},\qquad (11)$$

which yields the correct attenuation for the first order reflection according to a 1/r law.

It is important that equation (11) is satisfied, but the choice of gain made in equation (8) or (10) is not the only choice.

In this way, the digital reverberator 10 applies a 1/r gain to all signals extracted by the receiver node 24 assuming that the signal has just traveled from the source injection node 22 to the receiver node 24 via one surface reflection. It will be appreciated that for later stage reflections, the sound has reverberated around the connections between the SDN nodes and therefore this assumption is not strictly correct for those later reflections. However, we have found that it is better to prioritize the gain for the first-order reflection, even though later stage reflections are not so accurately simulated.

It is important to note that the receiver node 24 does not play any active part in the digital reverberator 10 in the sense that sound energy does not reverberate through it. This helps to improve computational efficiency since the scattering operation of an SDN node (e.g. matrix multiplication) does not have to be performed for this point in the network. In this way the digital reverberator 10 also provides a good approximation to physical reality: a receiver recording to sound in a room would have only a negligible impact on the acoustics.

Notice that the normalization value 2/(N−1) is such that the first-order reflection will only be attenuated according to the 1/r law in the case of a non-absorbing surface—identical wall absorption filter. In case scattering matrices S different from (5) are used, the normalization value should be modified to $$\frac{2}{\sum_{i=1}^{N-1}\sum_{j=1}^{N-1} S_{ij}}$$

where $S_{ij}$ is the entry on the i-th row and j-th column of the scattering matrix, so that the above condition is still satisfied.

Scalability and Interactivity

The digital reverberator 10 is scalable to different audio reproduction formats. For coincident receiver formats (e.g. Ambisonics), only the receiver gains $\Gamma_{Mk}(\theta)$ have to be adjusted. For the setups involving spatially separated receivers, one SDN reverberator has to be employed for each receiver. For near-coincident receiver setups, the same SDN node structure can be used, while creating new, dedicated SDN node-to-receiver delay lines for each receiver, at the cost of reducing the accuracy of the system slightly. It is also possible to obtain approximate virtual binaural recordings. To do this, a pair of head related transfer function filters (HRTF) for each SDN node and source injection node needs to be used.

The digital reverberator 10 also allows interactive operation, so as to be useful in dynamic environments such as virtual reality applications and computer games. For example in a computer game environment, the source injection node 22 might represent the position of an opponent from which various sounds emanate (e.g. gunfire, voice, etc.) and the receiver node 24 would represent the position of the character controlled by the user where those sounds are heard. To make the digital reverberator 10 dynamic, the model is updated to reflect changes in the positions and rotations of the source injection node and the receiving node. This requires adjusting the positions of the nodes, and updating the delay line lengths and gains accordingly. This could happen in real-time as the digital audio is being processed by the digital reverberator 10.

Transfer Function of the SDN Reverberator

Figure 7:
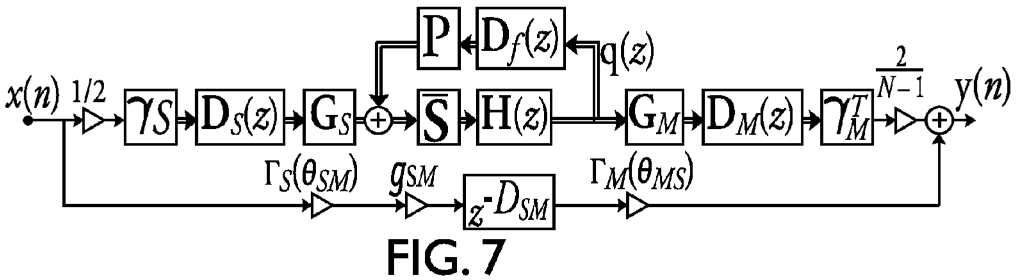
FIG. 7 is a schematic block diagram of one embodiment of a digital reverberator.

FIG. 7 shows a simplified block diagram of the SDN reverberator. In the figure, $$\gamma_S = [\underbrace{\Gamma_S(\theta_{S1}) \ldots \Gamma_S(\theta_{S1})}_{N-1}\Gamma_S(\theta_{S2}) \ldots \Gamma_S(\theta_{SN})]^T$$

$$\gamma_M = [\underbrace{\Gamma_M(\theta_{1M}) \ldots \Gamma_M(\theta_{1M})}_{N-1}\Gamma_M(\theta_{2M}) \ldots \Gamma_M(\theta_{NM})]^T$$

are the N(N−1)×1 source and receiver directivity vectors, $$D_S(z) = \mathrm{diag}(\underbrace{z^{-D_{S1}} \ldots z^{-D_{S1}}}_{N-1}, z^{-D_{S2}} \ldots z^{-D_{SN}})$$

$$D_M(z) = \mathrm{diag}(\underbrace{z^{-D_{M1}} \ldots z^{-D_{M1}}}_{N-1}, z^{-D_{M2}} \ldots z^{-D_{MN}})$$

are N(N−1)×N(N−1) source and receiver delay matrices, $$G_S = \mathrm{diag}(\underbrace{g_{S1} \cdots g_{S1}}_{N-1}, g_{S2} \cdots g_{SN})$$

$$G_M = \mathrm{diag}(\underbrace{g_{M1} \cdots g_{M1}}_{N-1}, g_{M2} \cdots g_{MN})$$

are the source and receiver attenuation matrices, $$\bar{S} = \mathrm{diag}(\underbrace{S, S, \ldots , S}_{N})$$

is a N(N−1)×N(N−1) (unitary) block diagonal matrix representing the overall scattering operation with $$S = \frac{2}{N-1}1_{N-1\times N-1} - I,$$

$$D_f(z)=\mathrm{diag}(z^{-D_{12}}, \ldots , z^{-D_{NN-1}})$$

is the N(N−1)×N(N−1) delay matrix representing the internode delays, $$H(z) = \mathrm{diag}(\underbrace{H_1(z) \ldots H_1(z)}_{N-1}, H_2(z) \ldots H_N(z))$$

is the N(N−1)×N(N−1) surface absorption matrix, P is a permutation matrix whose elements are determined based on adjacency of SDN nodes, $g_{SM}$ is the direct path attenuation from source to receiver, and $z^{-D_{SM}}$ is the direct path delay.

From inspection of FIG. 7 the system output can be expressed as:

$$y = \frac{2}{N-1}\gamma_M^T D_M G_M q + \bar{g}z^{-D_{SM}} \tag{12}$$

where $\bar{g}=g_{SM}\Gamma_S(\theta_{SM})\Gamma_M(\theta_{MS})$, and q is the state vector, which is given by $$q = H\bar{S}\left(PD_f q + \frac{1}{2}G_S D_S \gamma_S x\right) \tag{13}$$

$$= \frac{1}{2}(I - H\bar{S}PD_f)^{-1} H\bar{S}G_S D_S \gamma_S x \tag{14}$$

The transfer function of digital reverberator 10 can therefore be expressed as:

$$H(z) = \bar{g}z^{-D_{SM}} + \frac{1}{N-1}k_M(z)(H^{-1}(z) - \bar{S}PD_f(z))^{-1}\bar{S}k_S(z), \quad (15)$$

where $k_M = \gamma_M^T D_M G_M$ and $k_S = G_S D_S \gamma_S$.

It is observed that unlike FDN-type reverberators different acoustical aspects such as the direct path and reflection delays are clearly delineated so as to allow a direct correspondence to the acoustics of the modeled room and provides complete flexibility with respect to source and receiver positions and directivities. In addition, the inclusion of first-order reflections directly into the model makes using a separate early-reflection module unnecessary.

An artificial reverberator using a sparse network of scattering nodes was proposed by Smith [see J. O. Smith, III, "A new approach to digital reverberation using closed waveguide networks," in *Proc.* 11*th Int. Comput. Music Conf.*, Burnaby, BC, Canada, 1985, pp. 47-53], and further developed by Karjalainen et al. [see M. Karjalainen, P. Huang, and J. O. Smith, "Digital Waveguide Networks for Room Response Modeling and Synthesis," in *Proc.* 118*th Conv. Audio Eng. Soc., Preprint* #6394, Barcelona, Spain, 2005]. We will refer to the latter reverberator as a "DWN reverberator"; embodiments of a digital reverberator as disclosed herein have a number of significant differences, including (but not limited to):

In the DWN reverberator, the receiver node is itself a scattering node connected to the sparse DWM network, whereas the receiver node in the present digital reverberator is a passive element, which is actually the case for a real receiver. Therefore in the DWN reverberator computational overhead is increased because a matrix multiplication operation has to be performed on the signals arriving at the receiver node, and bidirectional delay lines have to connect the receiver node to each DWN scattering node. In contrast, the receiver node in the digital reverberator is connected to each SDN node by a unidirectional delay line, and in preferred embodiments, output signals are extracted from the inter-SDN node delay lines after all computationally intensive matrix multiplication is completed. The receiver node only has to apply a gain to implement the 1/r attenuation of the signals, which is computationally inexpensive.

In the DWN reverberator, additional waveguides co-directional with the room axes are connected to the receiver node, and these nodes are interconnected with some of the other scattering nodes. While accuracy of axial frequency modes is improved by this, it also increases the computational complexity.

In the DWN reverberator, the absorption losses are modeled by loading the DWN wall nodes with digital admittances with a resistive component for absorption simulation. To implement this, the DWN wall nodes are 'self-connected' using bi-directional delay lines. As the authors of the DWN reverberator reported the problem with this is that, in order to control reverberation time and improve naturalness, these admittance loads have to be tuned heuristically. This is a major disadvantage of the DWN reverberator making it impractical for implementation on a large scale (for example in a computer game with many rooms/spaces). In contrast the SDN nodes of the present digital reverberator do not have self-connections and, in preferred embodiments, absorptive losses are modeled by minimum-phase IIR filters on the bidirectional delay lines. This allows incorporation of surface materials with known absorption coefficients directly. This is a significant advantage: software developers are able to specify directly the surface materials of the room to be simulated. Via known frequency-dependent absorption characteristics of each material, the filter coefficients of each digital surface absorption filter will be automatically selected to best approximate the necessary real absorption characteristics. No heuristic tuning is required making large scale deployment (e.g. a computer game with tens, hundreds or thousands of rooms and spaces) practical.

In the DWN reverberator, only source-to-node and source-to-receiver attenuations were included. This causes inaccuracies in the magnitudes of the first-order reflections, particularly when the source is close to one of the surface nodes. This problem is addressed in the DWN reverberator by addition of separate delay lines from source injection node to receiver node according to the image source principle. On the other hand the present digital reverberator does not suffer from the same problem, since they are able to render first order reflections more accurately.

EXAMPLES

Figure 8A:
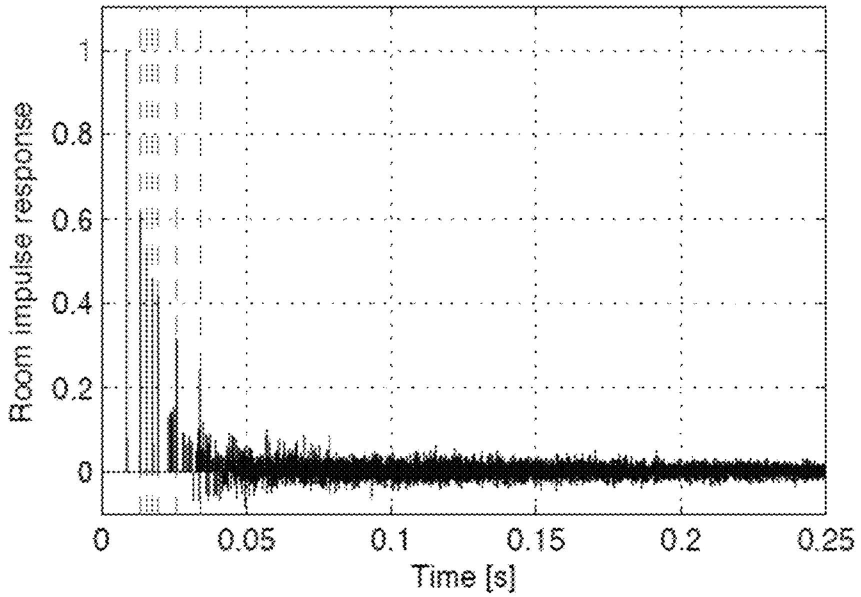
FIG. 8A is a graph of time against room impulse response produced by the digital reverberator for a room with uniform walls with a first frequency independent absorption characteristic.
Figure 8B:
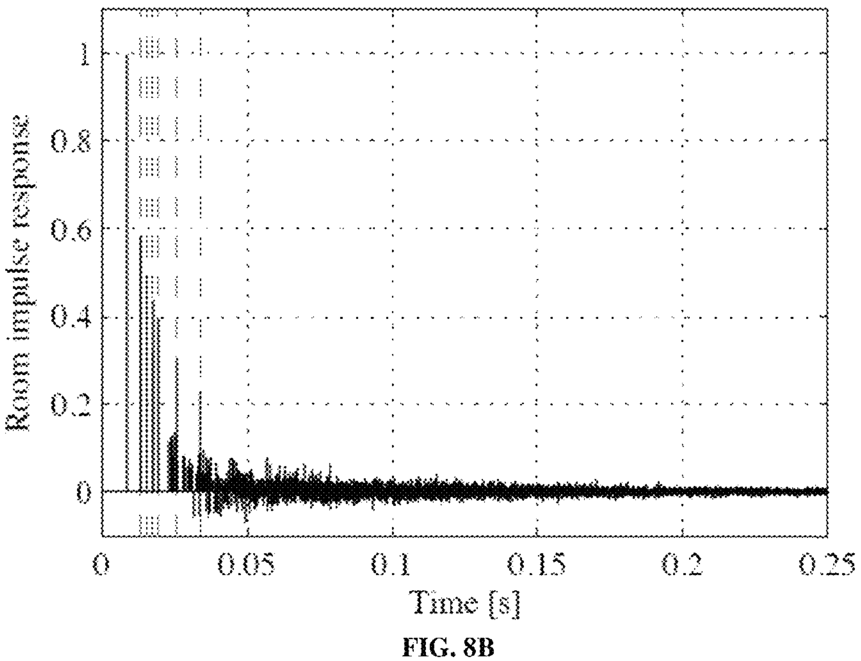
FIG. 8B is a graph of time against room impulse response produced by the digital reverberator for a room with uniform walls with a second frequency independent absorption characteristic.
Figure 8C:
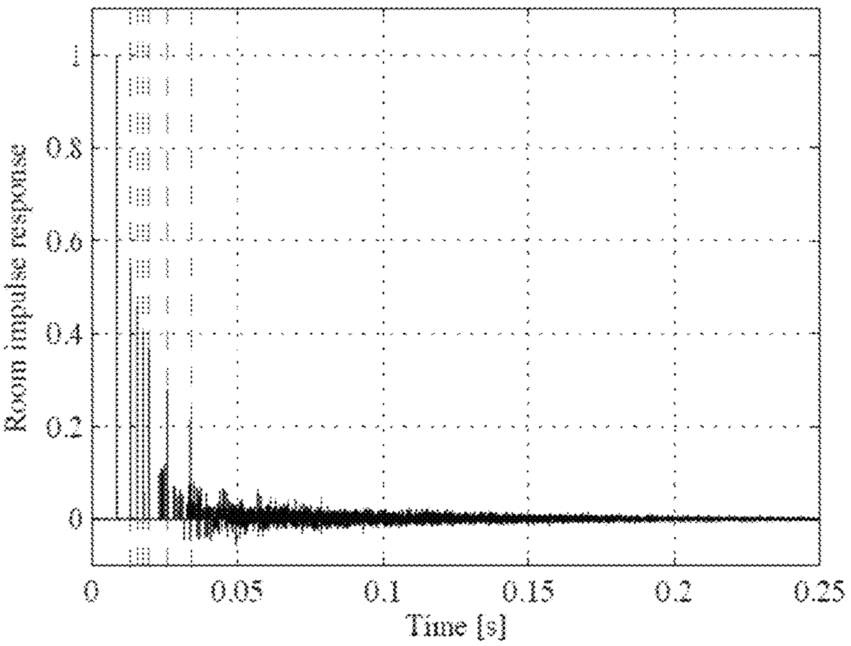
FIG. 8C is a graph of time against room impulse response produced by the digital reverberator for a room with walls with realistic frequency-dependent absorption (cement walls, cotton carpet, fissured ceiling tiles).

The RIRs of a rectangular cuboid room with dimensions $l=[l_x, l_y, l_z]=[9, 7, 4]$ is shown in FIGS. 8A-8C. Having defined the reference system origin in one of the room vertices, the source was placed at the centre of the room $x_s=[4.5, 3.5, 2]$, and the receiver at $x_s=[2, 2, 1.5]$. The characteristics of the digital surface absorption filters were adjusted before each impulse was input into the digital reverberator 10. In each of the Figures the highlighted vertical lines (dashed lines) indicate the time of arrival of first-order reflections in the real world.

In FIG. 8A all the surfaces have a frequency-independent absorption coefficient $\alpha=0.2$, which corresponds to surface filters of the kind $H_i(z)=\beta=\sqrt{1-\alpha}=0.89$, where $\beta$ is the reflection coefficient. It is observed in FIG. 8A that both attenuation and delay of first order reflections are correctly rendered by the model. In FIG. 8B a slightly higher absorption coefficient of $\alpha=0.3$ is employed. As expected, a similar response to the case $\alpha=0.2$ is obtained, but with a faster decay.

Actual rooms have surfaces with different absorption characteristics (brick wall, carpet, ceiling, etc.), which are also frequency dependent. FIG. 8C shows a more realistic example, where digital surface absorption filters $H_i(z)$ modeling these surfaces are employed. Each digital surface absorption filter was implemented as a minimum-phase IIR filter. The digital filter coefficients were optimized through damped Gauss-Newton method to fit the absorption coefficients reported by Vorländer in [see M. Vorlander, *Auralization: fundamentals of acoustics, modeling, simulation, algorithms and acoustic virtual reality*, Springer Verlag, 2008, the contents of which are fully incorporated herein by reference]. Nevertheless, it will be apparent that other approximation methods (such as the Yule-Walker method) and other real absorption coefficients can be used to select digital filter coefficients that best approximate a particular frequency dependent response of any material. Second or third order filters were used, which provided an acceptable residual error with low computational requirements. It is of course possible to use higher order filters if the required computing power is available. The floor covering was modeled as cotton carpet, while for the ceiling fissured ceiling tiles were used. The model for the side walls was average hard surface.

Figure 9:
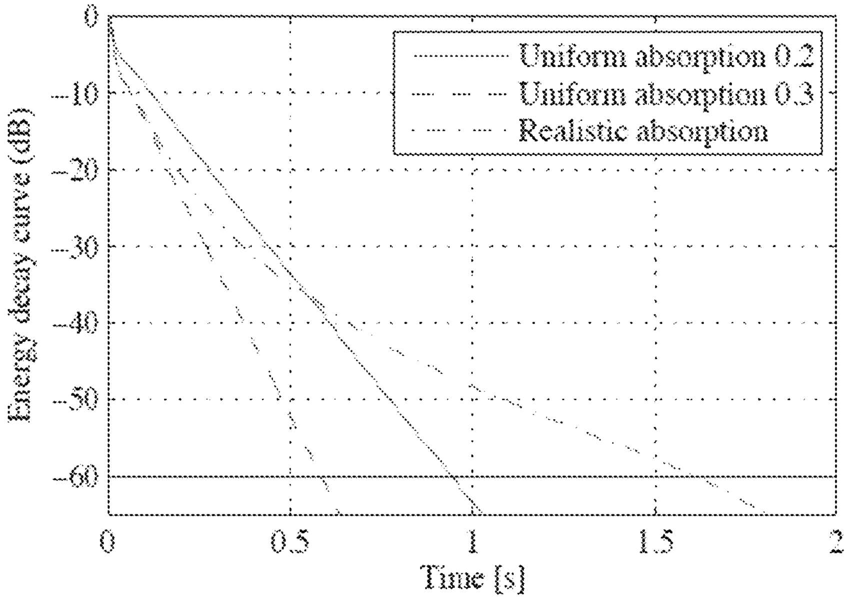
FIG. 9 is a graph of time against energy decay for the room impulse responses of FIGS. 8A to 8C.

Referring to FIG. 9 the energy decay curves (EDC) [see H. Kuttruff, *Room Acoustics*, SPON Press, London, UK, 4th edition, 2000, the contents of which are fully incorporated herein by reference] are shown for the three examples given above. For the two cases with uniform surfaces, the decay is consistently exponential, while for the more realistic case with frequency dependent absorption, a non-exponential decay is observed.

Reverberation Time

As a rough metric to assess the performance of the digital reverberator 10, the reverberation time predicted by the two well-known formulas according to Sabine [see H. Kuttruff, *Room Acoustics*, SPON Press, London, UK, 4th edition, 2000, the contents of which are fully incorporated herein by reference] and Eyring [see C. F. Eyring, "Reverberation time in "dead" rooms," *J. Acoust. Soc. Am.*, vol. 1, pp. 168, 1930, the contents of which are fully incorporated herein by reference] are considered:

$$T_{60,Sab} = \frac{0.161V}{\sum_i A_i\alpha_i} \quad (16)$$

$$T_{60,Eyr} = -\frac{0.161V}{\left(\sum_i A_i\right)\log_{10}\left(1-\sum_i A_i\alpha_i \Big/ \sum_i A_i\right)} \quad (17)$$

where $V=l_x \cdot l_y \cdot l_z$ is the room volume, $A_i$ and $\alpha_i$ are the area and absorption coefficient of the i-th surface, respectively. For the examples with frequency independent absorption presented in FIGS. 8A and 8B, the calculated reverberation time is $T_{60}$=0.94 for α=0.2, and $T_{60}$=0.58, for α=0.3. These values are close to the reverberation time predicted by Sabine formula. In fact $T_{60,Sab}$=0.80 for α=0.2 and $T_{60,Sab}$=0.53 for α=0.3.

As a more general assessment of the reverberation time rendered by the digital reverberator 10, cubic rooms with uniform and frequency independent absorption were simulated. The ISO recommendation [see International Standards Organization, "3382, Acoustics-Measurement of the reverberation time of rooms with reference to other acoustical parameters," 1997, the contents of which is incorporated by reference] suggests a minimum distance between source and receiver for the measurement of reverberation time. This distance is given by:

$$d_{min} = 2\sqrt{\frac{V}{cT_{est}}} \quad (18)$$

where $T_{est}$ is a rough estimation of the reverberation time. Observe that (18) is a function of the room size. Moreover, for small enclosures, the value of (18) can be bigger than the room itself, and, in this case, it is suggested in the ISO recommendation that the line-of-sight component should be removed. To avoid changing the experimental conditions when the size of the room is changed, source and receiver were both placed in the middle of the room. The line-of-sight component was removed in all cases before calculating $T_{60}$.

Figure 10A:
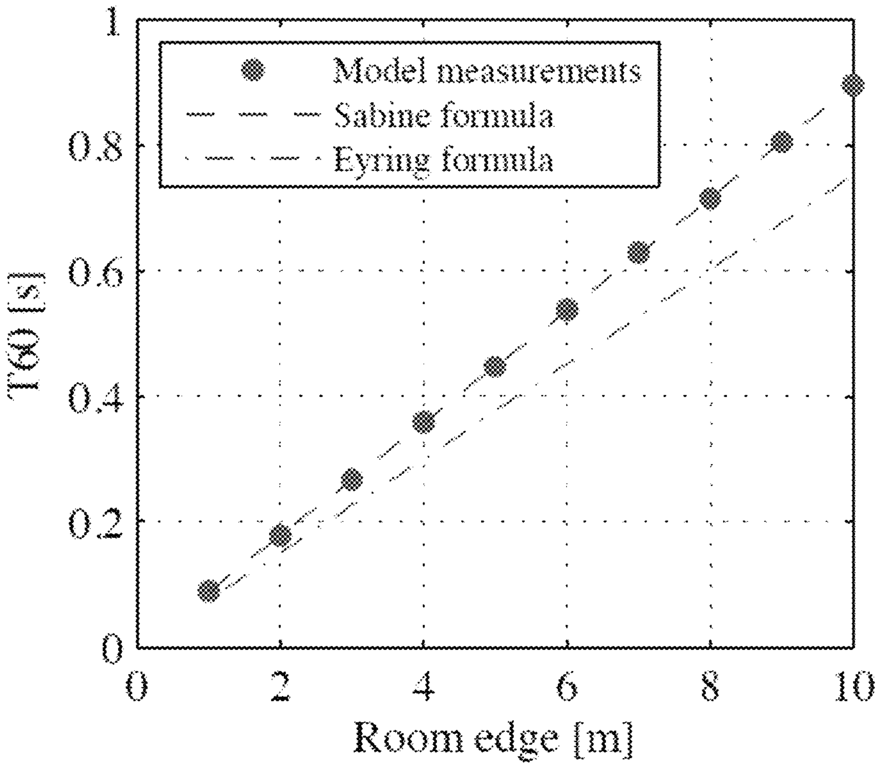
FIGS. 10A, 10B, and 10C are graphs of reverberation time against room size for different wall absorption coefficients.
Figure 10B:
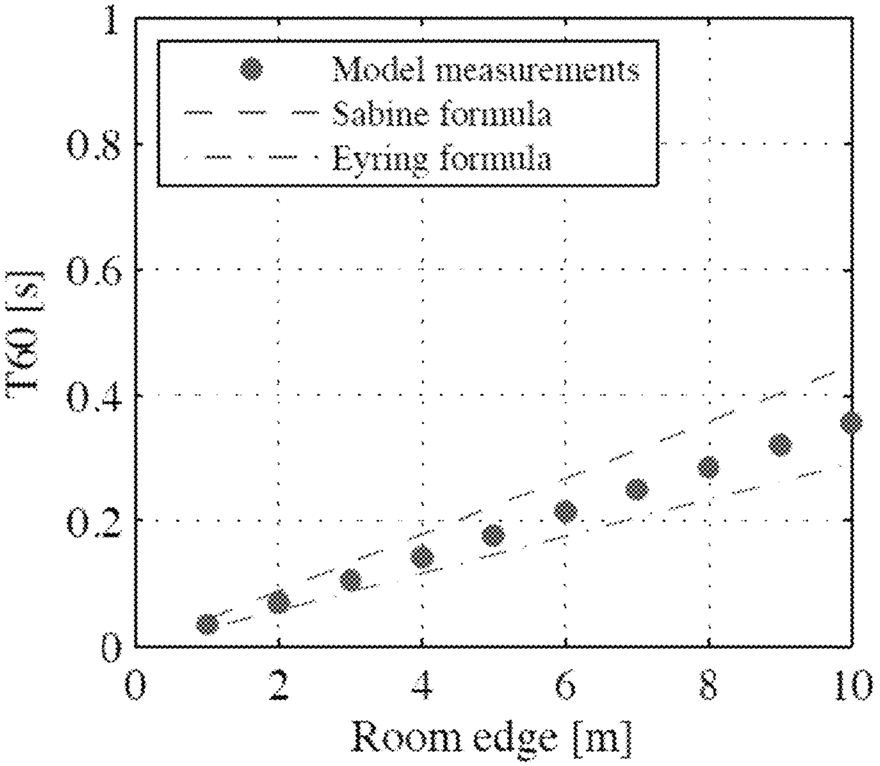
Figure 10C:
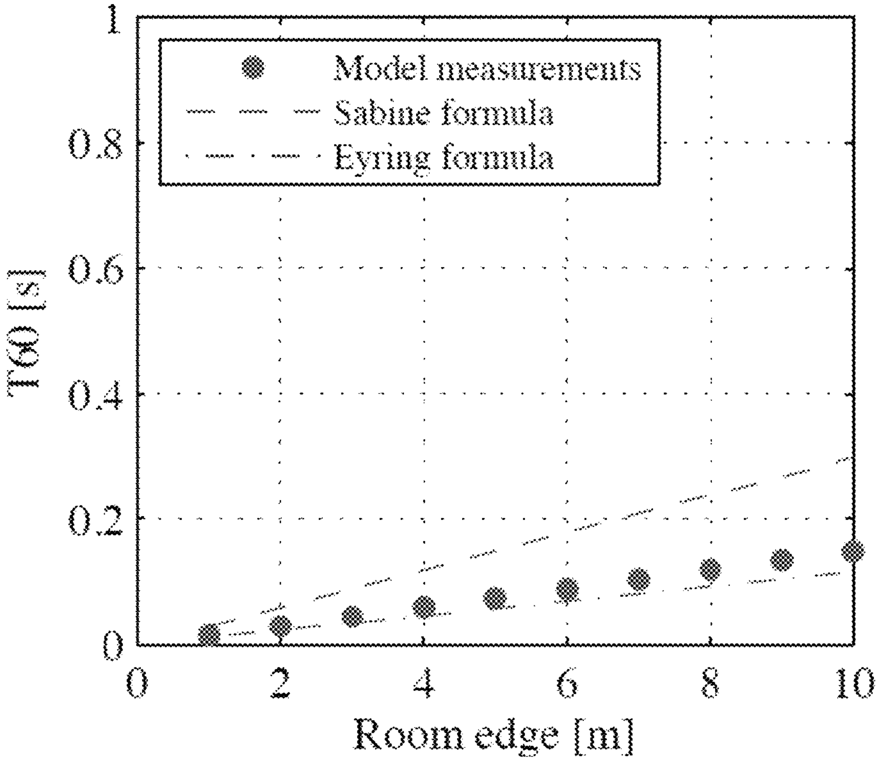

In FIGS. 10A-10C, results are shown for three different absorption coefficients α=0.3, 0.6, 0.9 respectively, and cubic rooms l=[r, r, r], with edge lengths r=1, . . . , 10 m. As a first remark, the digital reverberator generates a RIR with reverberation times that increase linearly with r. This is in agreement with both Sabine and Eyring formulas, which, in this simplified case, reduce to:

$$T_{60,Sab} = \frac{0.161r}{6\alpha},$$

$$T_{60,Eyr} = -\frac{0.161r}{6\log_{10}(1-\alpha)}.$$

Moreover, for α=0.3 the calculated $T_\alpha$ are very close to the predictions of Sabine formula. It is well known that Sabine formula tends to overestimate reverberation time for high absorptive materials [see the aforementioned Eyring reference]. As absorption gets higher (see FIGS. 10B and 10C), the reverberation time decreases at a greater rate than Sabine's formula, supporting the fact that the digital reverberator 10 produces consistent energy decay rates. Finally, the calculated $T_{60}$ values get closer to Eyring's formula (which is known to provide better approximation in rooms with more absorptive surfaces) as α increases.

Low Frequency Room Modes

Figure 11:
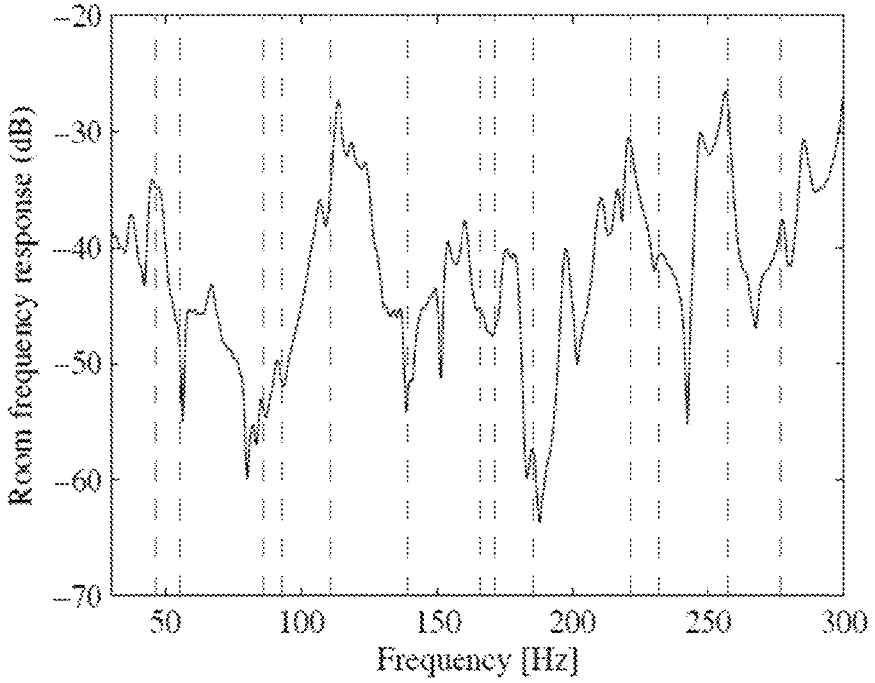
FIG. 11 is a graph of room frequency response against frequency.

2. One of the main acoustical properties of a room is given by its frequency modes, i.e. the frequencies that yield resonance phenomena in the room. For a rectangular cuboid enclosure, these acoustical modes (in Hertz) are given in the aforementioned Kuttruff reference as:

$$f_{n_x,n_y,n_z} = \frac{c}{2}\sqrt{\left(\frac{n_x}{l_x}\right)^2+\left(\frac{n_y}{l_y}\right)^2+\left(\frac{n_z}{l_z}\right)^2} \quad (19)$$

where $l_x$, $l_y$, and $l_z$ are the dimensions of the enclosure (in meters), c is the speed of sound in air and $n_x$, $n_y$, $n_z$=0, 1, . . . , +∞. Accurate room simulation models should render such frequency modes in the form of peaks and dips (depending on the position of source and receiver) in the room frequency response. Referring to FIG. 11 it is shown that the digital reverberator 10 exhibits this interesting feature, as most of the axial modes (i.e. $f_{n_x,0,0}$, $f_{0,n_y,0}$, and $f_{0,0,n_z}$) correspond to critical points in the low-frequency response. This example was run using a room with dimensions l=[2, 2.14, 3.74]. The source and receiver were positioned on the axis connecting the two opposite vertices and 1 m away from one another around the centre of the room. In order to highlight the modes, the absorption coefficient was set to the relatively low value of α=0.12

Frequency-Dependent Reverberation

It is discussed below that the reverberation time provided by the model in different octave bands follows the magnitude response characteristics of the digital surface absorption filter.

Among the realistic materials employed previously, cotton carpet was selected for all the walls. The employed filter H(z) was the same IIR minimum-phase filter used to generate the RIRs of FIGS. 8A to 8C. The source injection node and receiver node were positioned on the axis connecting the two opposite vertices of a cubic room l=[5, 5, 5]. They were positioned around the centre of the room, at a distance given by (18), where the $T_{est}$ was chosen using Sabine formula, which yielded $d_{min}$=2.96.

Figure 12:
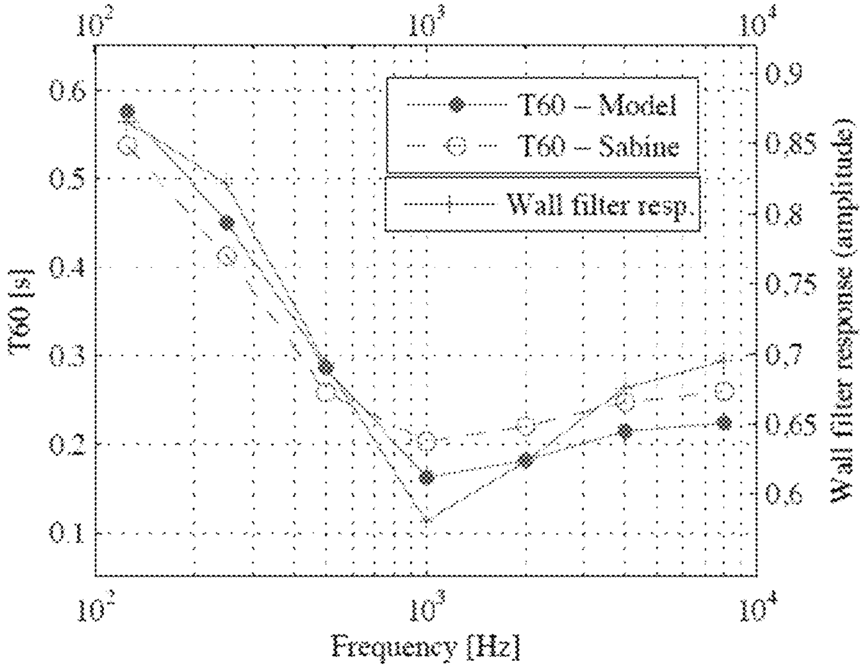
FIG. 12 is a graph showing the relationship between wall frequency response and reverberation time in different octave bands.

FIG. 12 shows the results of this simulation. Note the two different y-axes: the left axis relates to Sabine's and calculated, while the right axis refers to the amplitude of the digital surface filter response. The digital surface filter response is plotted, together with the corresponding Sabine predictions, obtained as:

$$T_{60,Sab} = \frac{0.161V}{\sum_i A_i \alpha_i(\omega)} = \frac{0.161 \cdot 5}{6\alpha(\omega)} = \frac{0.161 \cdot 5}{6(1 - |H(e^{j\omega})|^2)}$$

The simulated RIR output by the digital reverberator 10 was fed into an octave-band filter bank, and $T_{60}$ values were calculated for each octave-band. As shown in FIG. 12, these measured $T_{60}$ are very close to Sabine's formula prediction, thus confirming that the digital reverberator 10 allows for explicit control of surface properties.

Furthermore, in the event that direct control of reverberation time is preferred, the prediction functions (16) or (17) can be inverted to obtain $\alpha(\omega)$, and appropriate surface filters can be designed to fit $\alpha(\omega)$. To this end, Eyring's formula (17) is preferable [see aforementioned Eyring reference], as (16) is known to yield non-physical values $\alpha>1$ for some acoustically "dead" rooms.

Example Implementation

The digital reverberator 10 was initially simulated in MATLAB. Following that the digital reverberator 10 was implemented using C++ and compiled for use on an electronic device using the MACOS® operating system. In particular the digital reverberator was run on a MACBOOK PRO® with an INTEL® Core Duo2 2.53 GHz processor with 4 GB of RAM.

The C library 'Libsndfile' (available at the website identified as mega-nerd dot com/libsndfile/was used to read a WAV file from memory and input digital audio data into the digital audio input interface on the MACBOOK PRO was used. From the interface, the digital audio data was input into the digital reverberator which was implemented in C++ as 20 objects (e.g. one object was a junction, one object was a delay line, etc.). A WAV file of 1 second duration at a sampling frequency of 40 kHz took 0.07 s processing in an N=6 digital reverberator as described above with omnidirectional source and receiver nodes. PortAudio (portaudio dot com) was used to playback the digital audio through digital audio output interface.

One particular advantage of various embodiments disclosed herein is that digital audio data can be input directly into the digital reverberator—there is no need for a room impulse response to be determined first, and then a the digital audio data to be convolved with that response. Given the high computational cost of a convolution operation, this represents a significant improvement in terms of speed.

Refinements to the code of the digital reverberator are expected to further reduce computation overhead of embodiments of the digital reverberator.

Embodiments of the digital reverberator may be implemented in different ways. For example, in one embodiment, the digital reverberator is part of an electronic device such as a gaming console (for example stored in non-volatile memory). The digital reverberator may be incorporated into the electronic device at point of manufacture, or it could be incorporated via an upgrade to the electronic device. In that embodiment, digital audio data may be input into the digital reverberator from external media or network locations, or from the non-volatile memory.

In other embodiments, the digital reverberator may be provided on a portable data storage medium, such as a CD-ROM, as a set of computer-executable instructions, optionally together with digital audio data and/or computer graphics data. In use, the digital reverberator may be loaded into memory of the electronic device from the storage medium and digital audio samples and room dimension data processed to provide improved spatial sound for the user during use.

Fractional Delay Lines

Whilst the embodiments disclosed above utilize integer delay lines, it is possible to utilize fractional delay lines. This may be particularly useful when the source injection node and receiver node move at high speed relative to one another and/or relative to the virtual surfaces to avoid generation of possible artifacts in the output. Further details of how fractional delay lines may be implemented are contained in Julius O. Smith III, "Physical Audio Signal Processing for Virtual Musical Instruments and Digital Audio Effects (Volume 3)," W3K Publishing, December 2010, particular Chapter 4 entitled "Delay/Signal Interpolation" (the contents of which is fully incorporated herein by reference).

A digital reverberator capable of simulating the acoustics of a virtual room has been disclosed that is: (a) scalable in the sense that it can be used on consumer-grade computing equipment, and can be implemented in software without heuristic tuning of model parameters; and (b) interactive in the sense that it can be used in real-time as the source and receiver move.

The digital reverberator comprises junctions interconnected by bidirectional delay lines. These junctions are positioned at or near the points where first-order reflections originate. This way, the time-of-arrival of first-order reflections are simulated correctly, while a rich but less accurate reverberation tail is obtained. A digital surface absorption filter is implemented externally of each junction to model the absorption of sound by a surface (e.g. wall, ceiling, floor, object); the real frequency-dependent characteristics of surfaces can be implemented directly through the filter coefficients of each digital surface absorption filter, thereby reducing the need to tune model parameters heuristically. The receiving node of the digital reverberator is not an active part of the digital reverberating network, and is connected to the scattering junctions via unidirectional delay lines. This helps to reduce the computational overhead of the digital reverberator.

The digital reverberators disclosed herein are not limited to modeling the acoustics of conventional rooms with four walls, a floor and a ceiling. Other numbers of walls and surfaces are possible. Furthermore, the acoustics of a city street canyon could be approximately modeled by removing the virtual ceiling (or setting its height to zero) and two of the virtual walls.

It should also be noted that, whilst the term "surface" or "virtual surface" has been used throughout, this is intended to include wall, floors, ceilings, and other surfaces (e.g. table tops) that might be found in the virtual room to be simulated, as well as internal and external surfaces. The surface material of such surfaces may be any real or artificial material, or any theoretical material which exists only within a virtual environment which has properties designated by a designer. Any of these surface materials may have a frequency-dependent or frequency-independent response characteristic.

As used herein, the term "virtual room" is used to indicate any space in which the digital reverberator may be applied to simulate sounds. Whilst in certain embodiments the virtual room used by the digital reverberator can correspond directly to a real or computer-generated room (which may or may not contain other surfaces such as table tops), in other embodiments it may be used to simulate sounds in other spaces e.g. real or computer-generated open spaces containing reflective surfaces, streets or geographical features such as cliffs, caves, canyons, etc.

It is noted that the digital reverberator is not limited to simulation in rectangular room shapes, and can simulate using any room shape e.g. 'L'-shaped and circular (in two and three dimensions), although computational complexity increases with increasing numbers of surfaces.

Furthermore, whilst embodiments of the digital reverberator are particularly useful in any real-time computer-generated environment, such as gaming environments, the digital reverberator is not limited to this use. In particular, the digital reverberator can be employed in non-real-time. In that case, the digital reverberator may process sounds and the digital audio output signal may be stored in memory for later use. For example, the digital reverberator could be used to simulate in non-real-time the sound of a virtual building as a user walks through the building on a predetermined path; the output from the digital reverberator is stored in memory for later use, perhaps when an architect of the virtual building demonstrates it to a client. In other embodiments the digital reverberator could be used to simulate the sound of composited rooms and spaces in films and movies. The digital reverberator would work either in real-time for live broadcasts or non-real-time for pre-recorded TV and movies. In the former case the output of the digital reverberator could be broadcast by a digital television network. It would even be possible to pass copies of the same digital audio data through parallel digital reverberators that are configured for different user sound systems. That way the different outputs of each digital reverberator could be multiplexed into the digital TV signal (e.g. MPEG transport stream) so that a user can select the appropriate sound signal for decoding and playback.

The frequency range of human hearing is approximately 20 Hz-20 kHz and embodiments of the digital reverberator may process digital audio data representing sampled sound signals within this range. To further improve computational efficiency of the digital reverberator the upper frequency limit of the digital audio data may be reduced. This could be achieved by passing the digital audio data through a digital low-pass filter for example before it enters the digital reverberator.

In certain aspects a "consumer-grade" electronic device is any personal computer i.e. any general-purpose computer whose size, capabilities, and original sales price make it useful for individuals and businesses, and which is intended to be operated directly by an end-user with no intervening computer operator. Examples of such personal computers include stationary computers (e.g. workstation, desktop computer, gaming computer, single unit or all-in-one PCs, and Nettops) and mobile computers (e.g. laptop, desktop replacement of Netbook, tablet PC, ultra-mobile PC, pocket PC. The electronic device may also be a Smartphone or the like.

Although the embodiments of the invention described with reference to the drawings comprises computer apparatus and methods performed in computer apparatus, the invention also extends to computer programs, particularly computer programs on or in a carrier, adapted for putting the invention into practice. The program may be in the form of source code, object code, a code intermediate source and object code such as in partially compiled form, or in any other form suitable for use in the implementation of the methods according to the invention. The carrier may be any entity or device capable of carrying the program. For example, the carrier may comprise a storage medium, such as a ROM, for example a CD ROM or a semiconductor ROM, a magnetic recording medium, for example a floppy disc or hard disk, or a solid-state recording medium. Further, the carrier may be a transmissible carrier such as an electrical or optical signal that may be conveyed via electrical or optical cable or by radio or other means.

When the program is embodied in a signal that may be conveyed directly by a cable or other device or means, the carrier may be constituted by such cable or other device or means. Alternatively, the carrier may be an integrated circuit in which the program is embedded, the integrated circuit being adapted for performing, or for use in the performance of, the relevant methods.

While the invention has been disclosed in conjunction with a description of certain embodiments, including those that are currently believed to be the preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

The Invention claimed is:

1. An electronic device comprising:

an input data interface for receiving digital audio data;

a memory storing dimensions of a virtual room in which the digital audio data is to be emitted, the virtual room having a plurality of virtual surfaces;

a digital reverberator for simulating the sound of the digital audio data in the virtual room, the digital reverberator comprising:

a plurality of junctions distributed on the virtual surfaces of the virtual room, each junction connected to every other junction by a respective delay line, the delay lines and junctions forming a digital reverberation network within the virtual room, wherein each delay line connecting two junctions comprises a bidirectional delay line having an outgoing and an incoming delay line;

a source injection node in the virtual room for injecting the digital audio data into the digital reverberation network via delay lines connected with said plurality of junctions, whereby the digital audio data is reflected from the virtual surfaces of the virtual room and reverberates around the delay lines and junctions of the digital reverberation network;

a plurality of digital surface absorption filters, each of which is positioned on one of the delay lines to filter the digital audio data only once with each reflection from a virtual surface of the virtual room, so as to simulate absorption of sound by the virtual surfaces; and a receiver node in the virtual room for extracting the digital audio data from the digital reverberation network via delay lines, and for providing a digital audio output signal representing the reverberation of the digital audio data in the digital reverberation network; and an output data interface for receiving the digital audio output signal and outputting an audio signal;

wherein each delay line connecting the source injection node with a respective junction comprises a source unidirectional delay line in the direction from the source injection node to the junctions, each source unidirectional delay line having a separate injection point in the digital reverberation network through which digital audio data is input; and wherein each delay line connecting junctions of the digital reverberation network with the receiver node comprises a receiver unidirectional delay line in the direction from the junctions to the receiver node, each receiver unidirectional delay line having a separate extraction point in the digital reverberation network through which digital audio data is extracted.

2. The electronic device of claim 1 wherein there is one digital surface absorption filter positioned:(a) in each outgoing delay line of the digital reverberation network; and (b) before the delay applied by that outgoing delay line.

3. The electronic device of claim 1 wherein there is one digital surface absorption filter positioned in each incoming delay line of the digital reverberation network, after the delay applied by that incoming delay line.

4. The electronic device of claim 1 wherein each source unidirectional delay line comprises one of the digital surface absorption filters, and the outgoing delay lines of the digital reverberation network each comprise a respective one of the digital surface absorption filters positioned after the extraction point on the respective outgoing delay line.

5. The electronic device of claim 1 wherein each receiver unidirectional delay line comprises one of the digital surface absorption filters, and the outgoing delay lines of the digital reverberation network each comprise a respective one of the digital surface absorption filters positioned after the extraction point on the respective outgoing delay line.

6. The electronic device of claim 1 wherein each receiver unidirectional delay line comprises one of the digital surface absorption filters, and the incoming delay lines of the digital reverberation network each comprise a respective one of the digital surface absorption filters positioned before the injection point on the respective incoming delay line.

7. The electronic device of claim 1 wherein each source unidirectional delay line comprises one of the digital surface absorption filters, and the incoming delay lines of the digital reverberation network each comprise a respective one of the digital surface absorption filters positioned before the injection point on the respective incoming delay line.

8. The electronic device of claim 1 wherein said plurality of digital surface absorption filters comprises at least one infinite impulse response (IIR) filter comprising at least one filter coefficient that give the IIR filter a frequency response characteristic which approximates the frequency response characteristic of a surface material.

9. The electronic device of claim 1 wherein said plurality of digital surface absorption filters comprises at least one a finite impulse response (FIR) filter comprising at least one filter coefficients that give the FIR filter a frequency response characteristic which approximates the frequency response characteristic of a surface material.

10. The electronic device of claim 1 wherein there is one junction per virtual surface of said virtual room.

11. The electronic device of claim 10 wherein each junction is positioned substantially at a first-order reflection point on each virtual surface.

12. The electronic device of claim 11 wherein each source and receiver unidirectional delay line pair define a respective path for a first order reflection of the digital audio data from one of said junctions, the digital reverberator comprising a gain on each path to simulate attenuation of the digital audio signal as approximately 1/r, where r is the distance in the virtual room along each path.

13. The electronic device of claim 12 wherein said gain is positioned in said receiver unidirectional delay line, whereby all signals extracted from the digital reverberation network by the receiver node are attenuated as if they had traveled along that path.

14. The electronic device of claim 1 wherein the digital reverberator further comprises a unidirectional line-of-sight delay line between the source injection node and the receiver node.

15. The electronic device of claim 1 wherein said electronic device is a computing device.

16. A non-transitory computer-readable memory storing:

a plurality of digital audio samples;

computer graphics data including dimensions of a plurality of virtual rooms in which any one or more of the digital audio data samples can be emitted;

a digital reverberator for simulating the sound of the digital audio data in the virtual room, the digital reverberator comprising:

a plurality of junctions distributed on the virtual surfaces of the virtual room, each junction connected to every other junction by a respective delay line, the delay lines and junctions forming a digital reverberation network within the virtual room, wherein each delay line connecting two junctions comprises a bidirectional delay line having an outgoing and an incoming delay line;

a source injection node in the virtual room for injecting the digital audio data into the digital reverberation network via delay lines connected with said plurality of junctions, whereby the digital audio data is reflected from the virtual surfaces of the virtual room and reverberates around the delay lines and junctions of the digital reverberation network;

a receiver node in the virtual room for extracting the digital audio data from the digital reverberation network via delay lines, and for providing a digital audio output signal representing the reverberation of the digital audio data in the digital reverberation network; and a plurality of digital surface absorption filters, each of which is positioned on one of the delay lines to filter the digital audio data only once with each reflection from a virtual surface of the virtual room, so as to simulate absorption of sound by the virtual surfaces;

wherein each delay line connecting the source injection node with a respective junction comprises a source unidirect junctions, ional delay line in the direction from the source injection node to theeach source unidirectional delay line having a separate injection point in the digital reverberation network through which digital audio data is input; and wherein each delay line connecting junctions of the digital reverberation network with the receiver node comprises a receiver unidirectional delay line in the direction from the junctions to the receiver node, each receiver unidirectional delay line having a separate extraction point in the digital reverberation network through which digital audio data is extracted.

17. A method of digital sound reproduction for a user of an electronic device, the electronic device having a data input interface, a memory and a digital reverberator, the method comprising:

inputting digital audio in the digital interface;

retrieving from the memory dimensions of a virtual room in which the digital audio data is to be emitted, the virtual room having a plurality of virtual surfaces each of which has a set of digital filter coefficients associated therewith;

configuring the digital reverberator with the dimensions of the virtual room and each set of digital filter coefficients for virtual surfaces;

inputting the digital audio data into the digital reverberator for simulating the sound of the digital audio data in the virtual room, the digital reverberator performing:

providing a plurality of junctions distributed on the virtual surfaces of the virtual room, each junction connected to every other junction by a respective delay line, the delay lines and junctions forming a digital reverberation network within the virtual room, wherein each delay line connecting two junctions comprises a bidirectional delay line having an outgoing and an incoming delay line;

injecting the digital audio data in the digital reverberation network via a source injection node in the virtual room that is connected by delay lines with said plurality of junctions, each delay line connecting the source injection node with a respective junction comprising a source unidirectional delay line in the direction from the source injection node to the junctions, each source unidirectional delay line having a separate injection point in the digital reverberation network through which digital audio data is input, following which the digital audio data is reflected from the virtual surfaces of the virtual room and reverberates around the delay lines and junctions of the digital reverberation network;

filtering the digital audio data with a plurality of digital surface absorption filters, each of which is positioned on one of the delay lines to filter the digital audio data only once with each reflection from a virtual surface of the virtual room, so as to simulate absorption of sound by the virtual surfaces; and using a receiver node in the virtual room to extract the digital audio data from the digital reverberation network via delay lines, each delay line connecting junctions of the digital reverberation network with the receiver node comprising a receiver unidirectional delay line in the direction from the junctions to the receiver node, each receiver unidirectional delay line having a separate extraction point in the digital reverberation network through which digital audio data is extracted, and providing a digital audio output signal representing the reverberation of the digital audio data in the digital reverberation network; and receiving with a data output interface the digital audio output signal from the receiver node and outputting an audio signal.

* * * * *